United States Patent
Ohara

(10) Patent No.: US 10,847,655 B2
(45) Date of Patent: Nov. 24, 2020

(54) SEMICONDUCTOR DEVICE

(71) Applicant: Japan Display Inc., Tokyo (JP)

(72) Inventor: Hiroki Ohara, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/536,415

(22) Filed: Aug. 9, 2019

(65) Prior Publication Data

US 2019/0363192 A1 Nov. 28, 2019

Related U.S. Application Data

(63) Continuation of application No. 15/872,073, filed on Jan. 16, 2018, now Pat. No. 10,424,675.

(30) Foreign Application Priority Data

Feb. 14, 2017 (JP) .................................. 2017-025200

(51) Int. Cl.
| | |
|---|---|
| *H01L 29/786* | (2006.01) |
| *H01L 21/02* | (2006.01) |
| *H01L 21/321* | (2006.01) |
| *H01L 29/66* | (2006.01) |
| *H01L 27/12* | (2006.01) |

(52) U.S. Cl.
CPC .... *H01L 29/7869* (2013.01); *H01L 21/02271* (2013.01); *H01L 21/3212* (2013.01); *H01L 27/1214* (2013.01); *H01L 29/66742* (2013.01)

(58) Field of Classification Search
CPC ......................... H01L 29/7869; H01L 27/1214
See application file for complete search history.

(56) References Cited

U.S. PATENT DOCUMENTS

| | | | |
|---|---|---|---|
| 2007/0187760 A1* | 8/2007 | Furuta | H01L 29/41733 257/347 |
| 2012/0001167 A1 | 1/2012 | Morosawa | |
| 2012/0223308 A1 | 9/2012 | Okabe et al. | |
| 2015/0179747 A1 | 6/2015 | Ito et al. | |
| 2016/0087085 A1 | 3/2016 | Yamazaki et al. | |
| 2016/0087108 A1* | 3/2016 | Kwon | H01L 29/78618 349/43 |

FOREIGN PATENT DOCUMENTS

JP 2015-135962 A 7/2015

\* cited by examiner

*Primary Examiner* — Jay C Chang
*Assistant Examiner* — Mikka Liu
(74) *Attorney, Agent, or Firm* — Michael Best & Friedrich LLP

(57) ABSTRACT

A semiconductor device includes an oxide semiconductor layer above an insulating surface, a source electrode in contact with a side surface of the oxide semiconductor layer, a drain electrode in contact with a side surface of the oxide semiconductor layer, a gate insulating film above the oxide semiconductor layer, the source electrode, and the drain electrode, and, a gate electrode overlapping with the oxide semiconductor layer interposed by the gate insulating film. The gate electrode is arranged above and outside of the source electrode and the drain electrode.

3 Claims, 27 Drawing Sheets

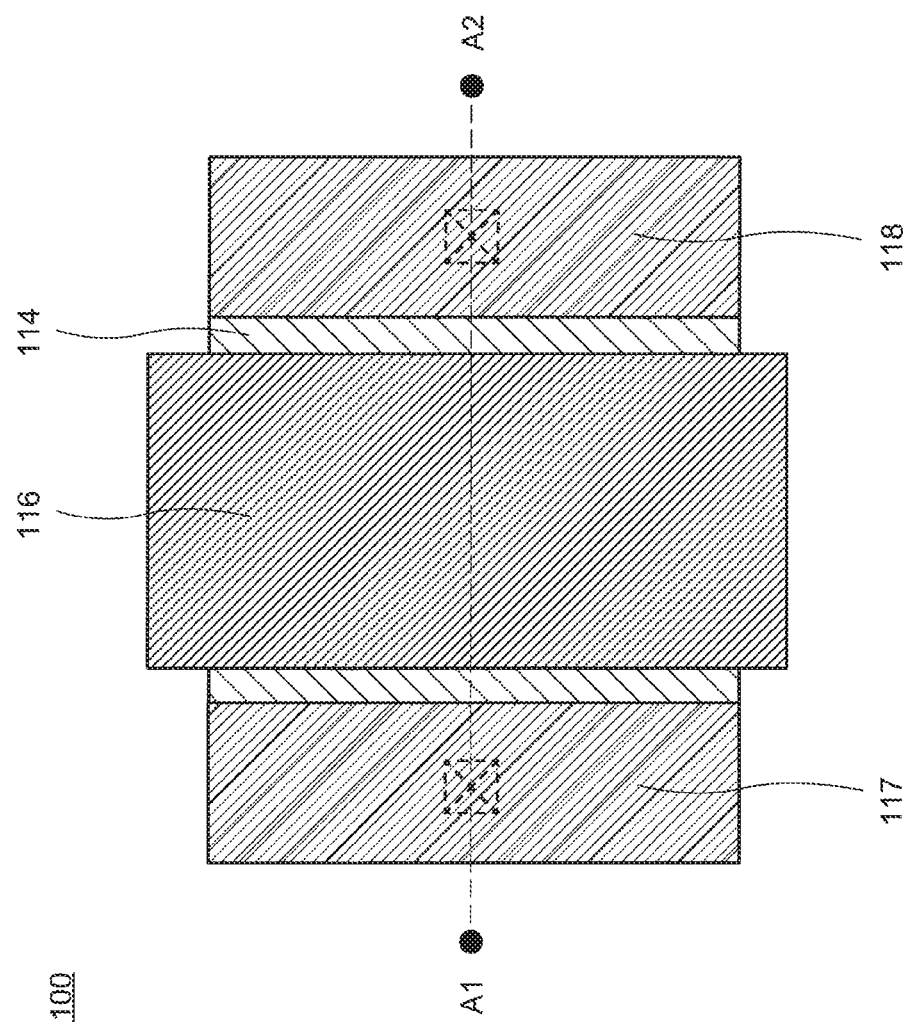

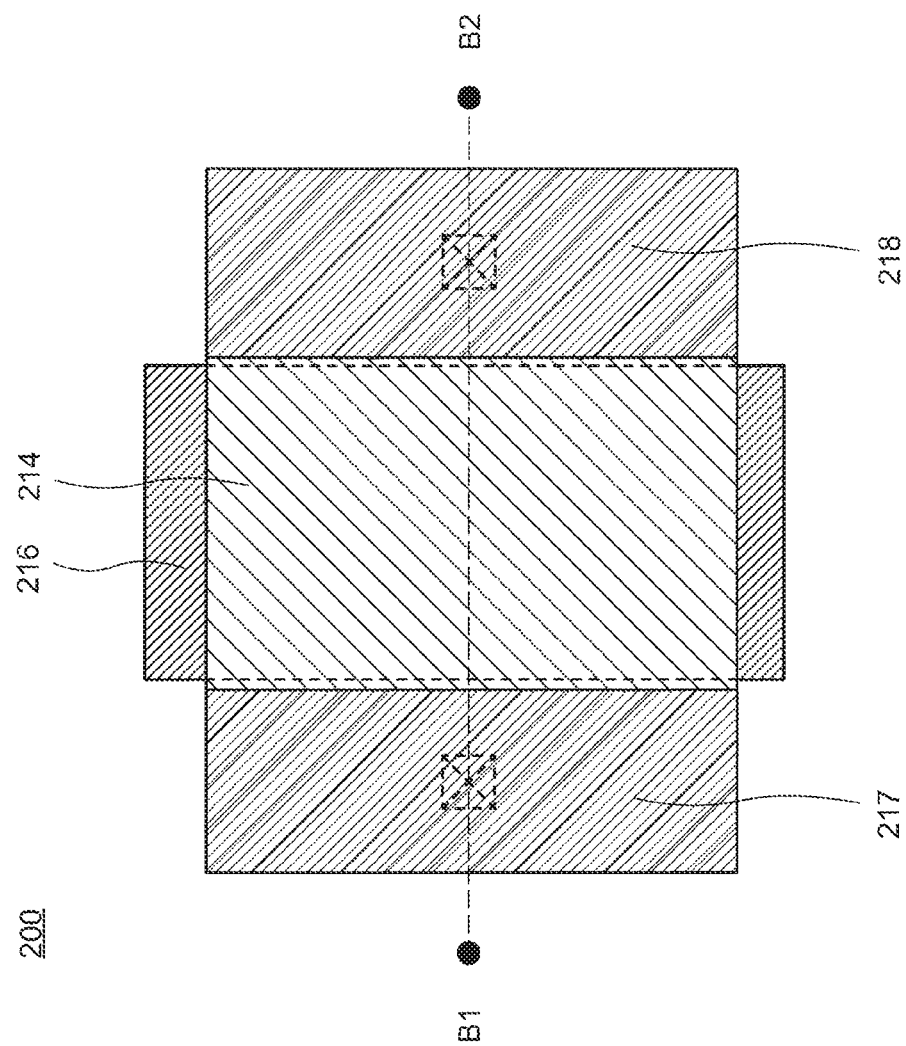

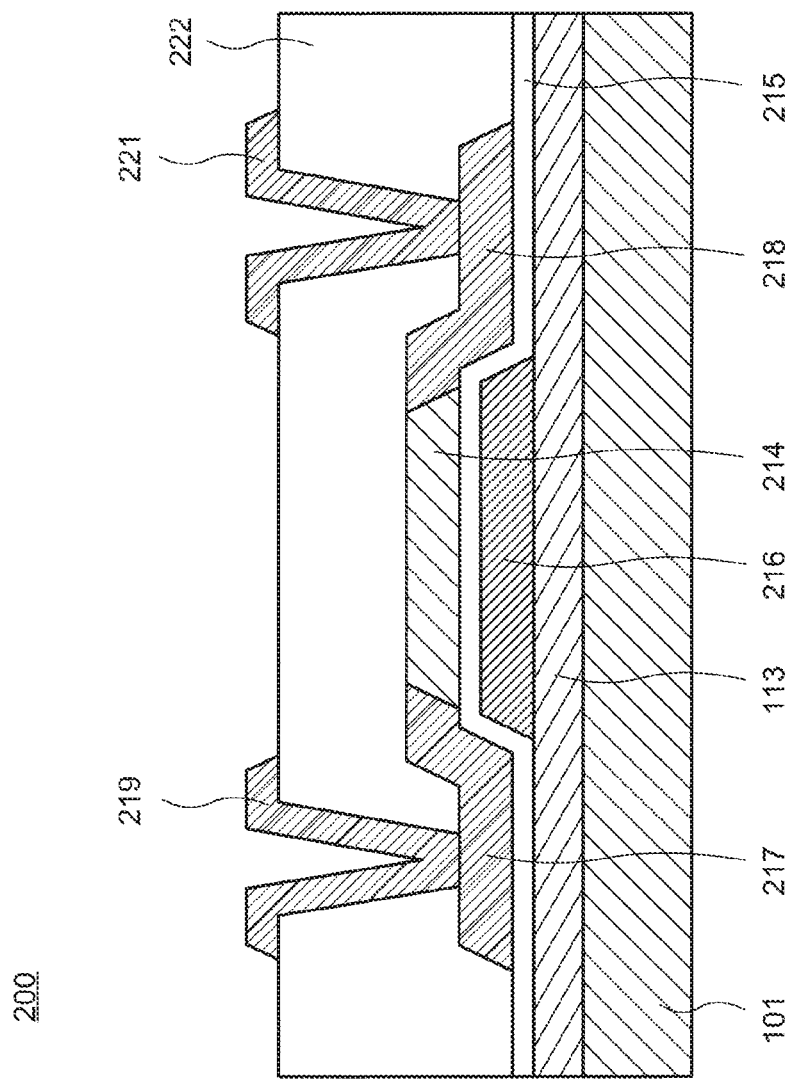

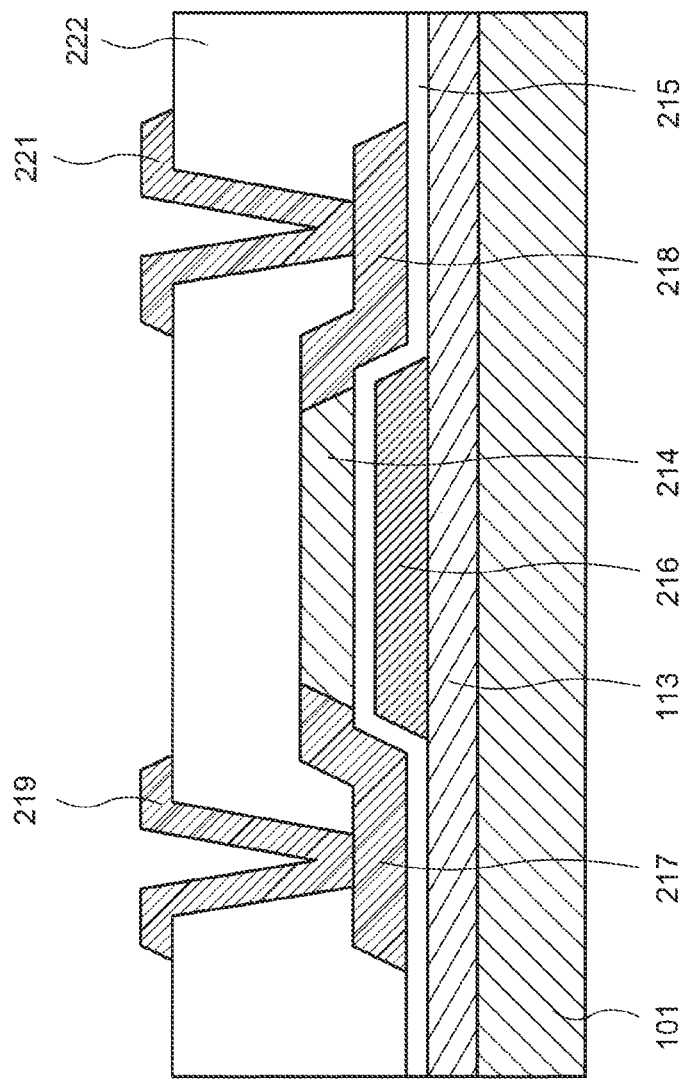

SEMICONDUCTOR DEVICE

CROSS REFERENCE TO RELATED APPLICATIONS

This application is a continuation of U.S. patent application Ser. No. 15/872,073 filed on Jan. 16, 2018. Further, this application is based upon and claims the benefit of priority from the prior Japanese Patent Application No. 2017-025200, filed on Feb. 14, 2017, the entire contents of which are incorporated herein by reference.

FIELD

One embodiment of the present invention is related to a semiconductor device including an oxide semiconductor and a method of manufacturing the same.

BACKGROUND

Conventionally, a transistor using silicon as a semiconductor layer has been used in a display device such as a liquid crystal display device or an organic EL display device. In recent years, demands for increasing the 20 area, increasing resolution and increasing the frame rate and the like in display devices have been increasing, and efforts to satisfy these demands have been actively carried out.

Thus, recently, development of a transistor using an oxide semiconductor instead of silicon has been proceeding. It is expected that a transistor including an oxide semiconductor can realize high mobility. In particular, it is possible to form an oxide semiconductor layer formed from IGZO at a relatively low temperature with a large area. As a result, oxide semiconductors are attracting attention as a material which satisfies the demands described above (for example, Japanese Laid Open Patent Application No. 2015-135962).

SUMMARY

A semiconductor device according to an embodiment of the present invention includes an oxide semiconductor layer above an insulating surface, a source electrode in contact with a side surface of the oxide semiconductor layer, a drain electrode in contact with a side surface of the oxide semiconductor layer, a gate insulating film above the oxide semiconductor layer, the source electrode, and the drain electrode, and, a gate electrode overlapping with the oxide semiconductor layer interposed by the gate insulating film. The gate electrode is arranged above and outside of the source electrode and the drain electrode.

A semiconductor device according to an embodiment of the present invention includes an oxide semiconductor layer above an insulating surface, a source electrode in contact with a side surface of the oxide semiconductor layer, a drain electrode in contact with a side surface of the oxide semiconductor layer, a gate insulating film above the oxide semiconductor layer, the source electrode, and the drain electrode, and a gate electrode above the oxide semiconductor layer interposed by the gate insulating film. The gate electrode does not overlap with the source electrode and drain electrode, and an end part of the source electrode and an end part of the drain electrode has a round shape in a cross-sectional view.

A semiconductor device according to an embodiment of the present invention a gate electrode above an insulating surface, a gate insulating film above the gate electrode, an oxide semiconductor layer above the gate electrode interposed by the gate insulating film, a source electrode in contact with a side surface of the oxide semiconductor layer, and a drain electrode in contact with a side surface of the oxide semiconductor layer. The gate electrode does not overlap with the source electrode and the drain electrode.

BRIEF DESCRIPTION OF DRAWINGS

FIG. 1A is a planar view of a semiconductor device related to one embodiment of the present invention;

FIG. 8A is a planar view of a semiconductor device related to one embodiment of the present invention;

FIG. 8B is a cross-sectional view of a semiconductor device related to one embodiment of the present invention;

FIG. 9F is a cross-sectional view of a manufacturing method of a semiconductor device related to one embodiment of the present invention;

DESCRIPTION OF EMBODIMENTS

Each embodiment of the present invention is explained below while referring to the diagrams. However, it is possible to perform the present invention using various different aspects within a scope that does not depart aspect the concept of the present invention and the present invention should not be limited to the content described in the embodiments exemplified herein.

Although the width, thickness and shape of each component are shown schematically compared to their actual form in order to better clarify explanation, the drawings are merely an example and should not limit an interpretation of the present invention. In the specification and each drawing, the same reference symbols are attached to similar elements and elements that have been mentioned in previous drawings, and therefore a detailed explanation may be omitted where appropriate.

In the present invention, when a single film is processed to form a plurality of films, these films may have different functions and roles. However, the plurality of films are derived from films formed in the same layer by the same process and have the same layer structure and the same material. Therefore, these films are defined as existing in the same layer.

In the present specification and the scope of the claims, in the case of simply denoting "above" when expressing a mode of in which another structure is arranged on a certain structure, unless otherwise noted a case where another structure is arranged directly above a certain structure as if in contact with that structure, and a case where another structure is arranged via another structure above a certain structure, are both included.

First Embodiment

In the present embodiment, a semiconductor device according to an embodiment of the present invention explained while referring to FIG. 1 to FIG. 6. In the present embodiment, the structure of a top-gate transistor is explained.

<Structure of Semiconductor Device>

Figure 1B:
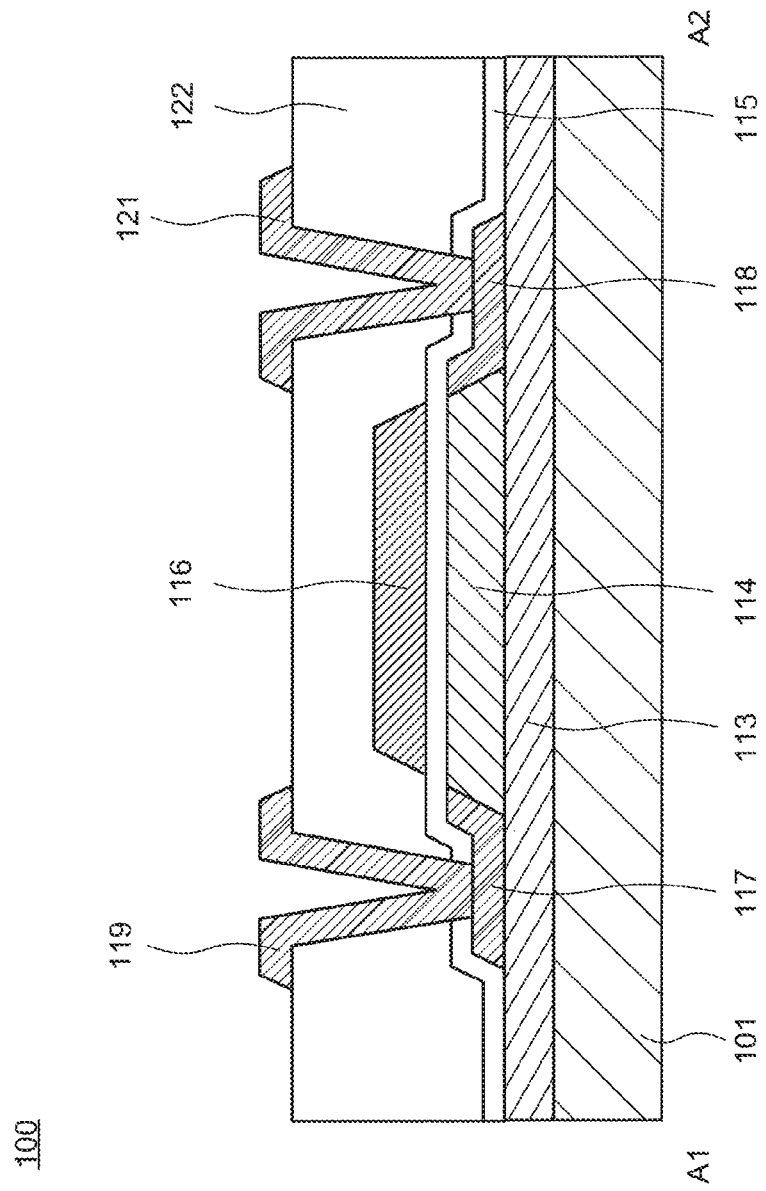
FIG. 1B is a cross-sectional view of a semiconductor device related to one embodiment of the present invention.

An overview of a semiconductor device 100 according to a first embodiment of the present invention is explained while referring to FIG. 1A and FIG. 1B.

FIG. 1A is a planar view of the semiconductor device 100 according to the present embodiment. FIG. 1A shows an oxide semiconductor layer 114, a conducting layer 116, a conducting layer 117 and a conducting layer 118 as the semiconductor device 100. FIG. 1B is a diagram showing a cross-sectional structure of the semiconductor device shown in FIG. 1A along the line A1-A2. FIG. 1B shows a substrate 101, an insulating layer 113, the oxide semiconductor layer 114, the conducting layer 117, the conducting layer 118, an insulating layer 115, the conducting layer 116, an insulating layer 122, the conducting layer 119 and the conducting layer 121 as a semiconductor device 100. Furthermore, in FIG. 1B, a case where a film thickness of the oxide semiconductor layer 114 is thicker than a film thickness of the conducting layer 117 and the conducting layer 118 is explained.

A glass substrate, a quartz substrate, a flexible substrate (polyimide, polyethylene terephthalate, polyethylene naphthalate, triacetyl cellulose, cyclic olefin copolymer, cycloolefin polymer or other resin substrate having flexibility) can be used as the substrate 101. In the case when it is not necessary for the substrate 101 to have translucency, it is also possible to use a metal substrate, a ceramic substrate or a semiconductor substrate.

The insulating layer 113 functions as an underlayer. The insulating layer 113 is a film having a function for preventing impurities such as alkali metal from diffusing into the oxide semiconductor layer 114 and the like and also functions as a barrier film. It is possible to use silicon nitride (SiNx), silicon nitride oxide (SiNxOy), aluminum nitride (AlNx), aluminum nitride oxide (AlNxOy), aluminum oxide (AlOx), aluminum oxynitride (AlOxNy) or the like for the insulating layer 113, (x and y are arbitrary). In addition, SiwAlxOyNz (also called SiAlON) in which SiNx and AlOx are compounded can also be used as the insulating layer 113. In addition, the insulating layer 113 may have a structure in which these films are stacked.

In a transistor including an oxide semiconductor layer, if hydrogen mixed into the oxide semiconductor layer, then hydrogen may create a donor defects, which causes a shift in a threshold voltage and deterioration of transistor characteristics. As a result, it is preferred to use a film having a low hydrogen concentration as the insulating layer 113 in contact with the oxide semiconductor layer 114.

The oxide semiconductor layer 114 is arranged above an insulating surface of the substrate 101 and the insulating layer 113 and the like. The oxide semiconductor layer 114 can include a group 13 element such as indium or gallium. The oxide semiconductor layer 114 may contain a plurality of different Group 13 elements or a compound of indium and gallium (IGO). The oxide semiconductor layer 114 may further contain a Group 12 element, for example, a compound (IGZO) containing indium, gallium, and zinc. The oxide semiconductor layer 114 can include other elements and may include tin which is a group 14 element, and titanium or zirconium which are group 4 elements or the like. Crystallinity of the oxide semiconductor layer 114 is also not limited and may be single crystal, polycrystal, microcrystal or amorphous. The oxide semiconductor layer 114 is preferred to have few crystal defects such as oxygen voids. In addition, it is preferred that the concentration of hydrogen in the oxide semiconductor layer 114 is low.

The conducting layer 117 and the conducting layer 118 function as a source electrode or a drain electrode. The conducting layer 117 and the conducting layer 118 are arranged in contact with a side surface of the oxide semiconductor layer 114. For example, aluminum (Al), titanium (Ti), chrome (Cr), cobalt (Co), nickel (Ni), zinc (Zn), molybdenum (Mo), copper (Cu), indium (In), tin (Sn), hafnium (Hf), tantalum (Ta), tungsten (W), platinum (Pt) and bismuth (Bi) and the like can be used for the conducting layer 117 and the conducting layer 118. In addition, alloys of these metals may also be used. In addition, conductive oxides such as ITO (indium tin oxide), IGO (indium gallium oxide), IZO (indium zinc oxide) and GZO (zinc oxide doped with gallium as a dopant) may also be used. In addition, the conducting layer 117 and the conducting layer 118 may have a single layer structure or a stacked layer structure.

The insulating layer 115 functions as a gate insulating film. The insulating layer 115 is arranged above the oxide semiconductor layer 114, the conducting layer 117 and the conducting layer 118. In addition, in the insulating layer 115 includes a first region in contact with an upper surface of the oxide semiconductor layer 114, a second region in contact with an upper surface of the conducting layer 117, and a third region in contact with an upper surface of the conducting layer 118. The first region, second region, third region have a flat surface. In addition, the insulating layer 115 is can be formed using silicon nitride (SiNx), silicon nitride oxide (SiNxOy), silicon oxide (SiOx), silicon oxynitride (SiOxNy), aluminum nitride (AlNx), aluminum nitride oxide (AlNxOy) and aluminum oxynitride (AlOxNy) or the like (x and y are arbitrary). SiwAlxOyNz in which SiNx and AlOx are compounded can also be used as the insulating layer 115. In addition, the insulating layer 115 may have a structure in which these films are stacked. Furthermore, the contained amount of hydrogen included in the insulating layer 115 is preferred to be low.

The conducting layer 116 functions as a gate electrode. The conducting layer 116 is arranged above the oxide semiconductor layer 114 interposed by the insulating layer 115 therebetween. In addition, the conducting layer 116 is arranged so as to not overlap with the conducting layer 117 and the conducting layer 118. A material similar to that of the conducting layer 117 and 118 can be used as the conducting layer 116. In addition, the conducting layer 116 may have a single layer structure or a stacked layer structure.

The insulating layer 122 functions as an interlayer insulating film. Openings which expose the conducting layer 117 and the conducting layer 118 are arranged in the insulating layer 122. The same material as the insulating layer 115 can be used as the insulating layer 122. In addition, the insulating layer 122 may have a single layer structure or a stacked layer structure.

The conducting layer 119 and the conducting layer 121 function as wiring. The conducting layer 119 and the conducting layer 121 are connected to the conducting layer 117 and the conducting layer 118 via the opening formed in the insulating layer 122. The same materials as those of the conducting layer 117 and the conducting layer 118 can be used as the conducting layer 119 and the conducting layer 121. In addition, the conducting layer 119 and the conducting layer 121 may have a single layer structure or a stacked layer structure.

Along with the increase in definition of display devices, it is necessary to miniaturize elements such as transistors which form pixels. In addition, along with the miniaturization of transistors, parasitic capacitance becomes larger due to overlapping of wiring and an RC delay occurs. As a result of this RC delay, circuit operation is delayed and there is a possibility that display performance is reduced.

Therefore, one object of an embodiment of the present invention is to provide a semiconductor device in which parasitic capacitance due to overlapping of wirings is reduced and a RC delay is suppressed.

The conducting layer 117 and the conducting layer 118 which are in contact with a side surface of the oxide semiconductor layer 114 and function as a source electrode or a drain electrode are arranged in the semiconductor device 100 shown in FIG. 1A and FIG. 1B. Specifically, as is shown in FIG. 1B, an end part of the lower surface of the conducting layer 116 matches an end part of the upper surface of the oxide semiconductor layer 114 or is located further to the inside than an end part of the upper surface of the oxide semiconductor layer 114. Here, substantially matching means that the end part of the lower surface of the conducting layer 116 can be considered as substantially matching as long as it is within ±10 nm from the end part of the upper surface of the oxide semiconductor layer 114.

In addition, in the conducting layer 117 and the conducting layer 118, an end part of a surface in contact with the oxide semiconductor layer 114 substantially matches an end part of the upper surface of the oxide semiconductor layer 114, or is located in a lower position than an end part of the upper surface of the oxide semiconductor layer 114. Furthermore, substantially matching means for example, if the end parts of the conducting layer 117 and the conducting layer 118 are located in a higher position by 1 nm to 10 nm than the end part of the upper surface of the oxide semiconductor layer 114. In this way, by arranging the conducting layer 116 so as not to overlap the conducting layer 117 and the conducting layer 118, it is possible to reduce parasitic capacitance in the semiconductor device 100. In this way, it is possible to suppress the RC delay due to parasitic capacitance.

In addition, in the insulating layer 115 which functions as a gate insulating film includes the first region in contact with the upper surface of the oxide semiconductor layer 114, the second region in contact with the upper surface of the conducting layer 117, and the third region in contact with the upper surface of the conducting layer 118. The first region, the second region, and third region have a flat surface. In this way, it is possible to arrange the insulating layer 115 which has good coverage above the oxide semiconductor layer 114, the conducting layer 117 and the conducting layer 118.

<Manufacturing Method of Semiconductor Device>

Next, a method of manufacturing the semiconductor device 100 according to the present embodiment is explained while referring to FIG. 2A to FIG. 2F.

Figure 2A:
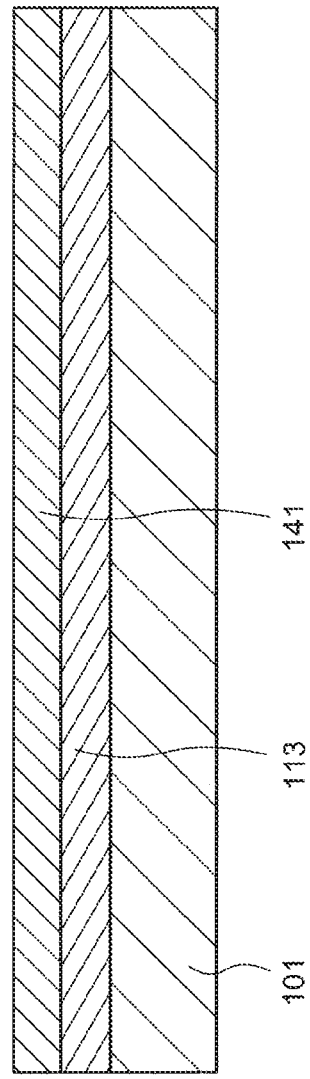
FIG. 2A is a cross-sectional view of a manufacturing method of a semiconductor device related to one embodiment of the present invention.

First, as is shown in FIG. 2A, the insulating layer 113 which functions as an underlayer is formed above the substrate 101. The insulating layer 113 can be formed having a single layer structure or a stacked layer structure using the materials described above by a CVD method, a sputtering method or a lamination method and the like. A film thickness of the insulating layer 113 is set to 50 nm or more and 1000 nm or less.

Figure 2B:
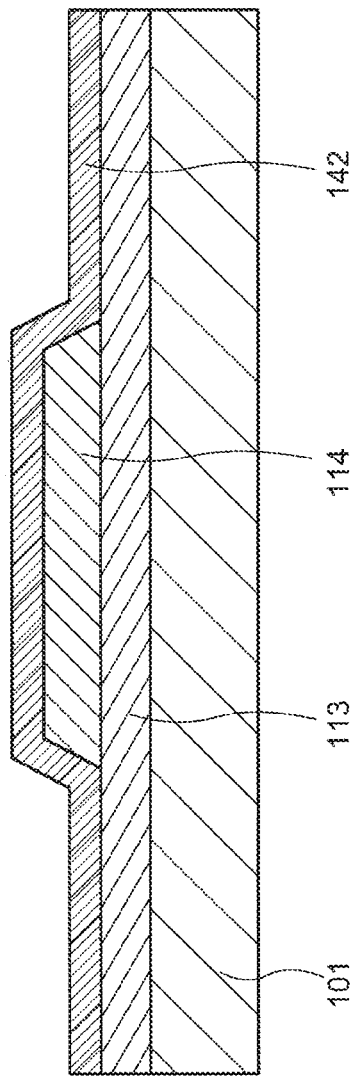
FIG. 2B is a cross-sectional view of a manufacturing method of a semiconductor device related to one embodiment of the present invention.

Next, as is shown in FIG. 2B, the oxide semiconductor film 141 is formed above the insulating layer 113. The oxide semiconductor film 141 is preferred to be formed, for example, by a sputtering method. In addition, the oxide semiconductor film 141 is formed considering that the thickness of the oxide semiconductor film 141 is reduced by a subsequent polishing process. The thickness of the oxide semiconductor film 141 is set to 25 nm or more and 150 nm or less, preferably 30 nm or more and 100 nm or less and more preferably 40 nm or more and 70 nm or less. In the case when a sputtering method is used, the formation of the oxide semiconductor film 141 is applied by heating the substrate in an atmosphere including oxygen gas, for example, a mixed atmosphere including argon and oxygen. At this time, the partial pressure of argon may be lower than the partial pressure of oxygen.

In addition, power supply to be applied to a target can be a direct current or an alternating current power supply, and can be determined by the shape and composition of the target. For example, InGaZnO, In:Ga:Zn:O=1:1:1:4 ($In_2O_3$:$Ga_2O_3$:ZnO=1:1:2) or the like can be used as the target. In addition, it is possible to determine the composition ratio according to the purpose such as transistor characteristics and the like.

In addition, a thermal treatment may be applied to the oxide semiconductor film 141. The thermal treatment may be applied before patterning or after patterning of the oxide semiconductor film 141. Since the volume of the oxide semiconductor film 141 sometimes decreases (shrinks) due to a thermal treatment, it is preferred to apply a thermal treatment before patterning. In addition, by applying a thermal treatment on the oxide semiconductor film 141, it is possible to reduce a hydrogen concentration, improve density and improve film quality of the oxide semiconductor film 141.

The thermal treatment applied to the oxide semiconductor film 141 can be applied at atmospheric pressure or low pressure (vacuum) in the presence of nitrogen, dry air or air. Heating is applied at a temperature of 250° C. to 500° C. and preferably 300° C. to 450° C. In addition, the heating time is, for example, 15 minutes to 1 hour. By applying a thermal treatment, oxygen is introduced or transferred into oxygen voids in the oxide semiconductor film 141, whereby it is possible to obtain an oxide semiconductor film 141 having few crystal defects and high crystallinity. In addition, by applying a thermal treatment, it is possible to reduce the hydrogen concentration of the oxide semiconductor film 141.

Next, as is shown in FIG. 2B, the oxide semiconductor film 141 is patterned and the oxide semiconductor layer 114 is formed. Next, a conducting film 142 is formed above the oxide semiconductor layer 114. The conducting film 142 is a film which becomes the conducting layer 117 and the conducting layer 118 which function as a source electrode or a drain electrode in a later process. It is possible to form the conducting film 142 with a single layer structure or a stacked layer structure by a sputtering method using the materials described above. The film thickness of the conducting film 142 is formed to be smaller than the film thickness of the oxide semiconductor layer 114. In the present embodiment, a case where the film thickness of the conducting film 142 is smaller than the film thickness of the oxide semiconductor layer 114 is explained.

Figure 2C:
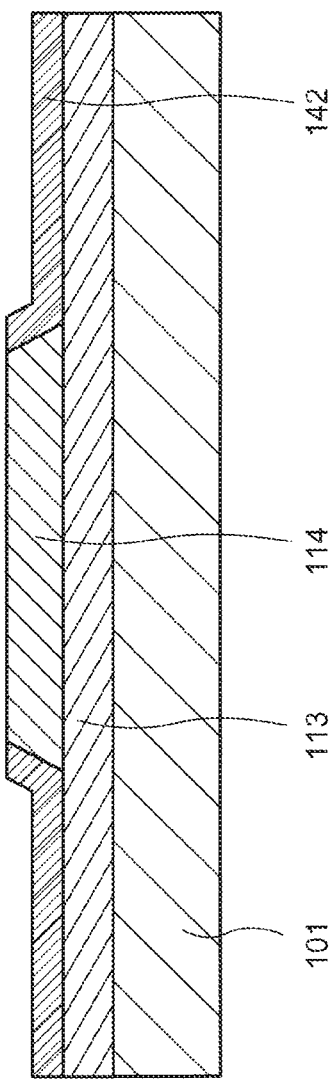
FIG. 2C is a cross-sectional view of a manufacturing method of a semiconductor device related to one embodiment of the present invention.

Next, as is shown in FIG. 2C, chemical mechanical polishing is carried out on the conducting film 142 in order to expose the upper surface of the oxide semiconductor layer 114. By applying chemical mechanical polishing on the conducting film 142, it is possible to planarize the upper surface of the oxide semiconductor layer 114 and the upper surface of the conducting film 142.

Figure 2D:
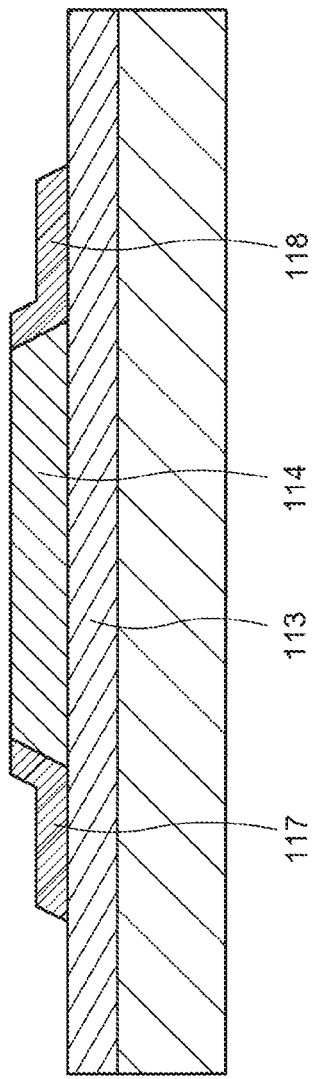
FIG. 2D is a cross-sectional view of a manufacturing method of a semiconductor device related to one embodiment of the present invention.

Next, as is shown in FIG. 2D, by patterning the conducting film 142, the conducting layer 117 and the conducting layer 118 which function as a source electrode or a drain electrode are formed.

Furthermore, a plasma treatment may be applied to the oxide semiconductor layer 114. The plasma treatment may be applied after the oxide semiconductor film 141 is formed, after the polishing treatment of the conducting film 142 or after patterning of the conducting film 142. There is a danger of oxygen defects occurring in the oxide semiconductor layer 114 by polishing the conducting film 142. Therefore, it is preferred to apply the plasma treatment after polishing the conducting film 142. The plasma treatment can be applied at atmospheric pressure plasma or low pressure (vacuum) using $O_2$ gas or $N_2O$ gas. By applying the plasma treatment on the oxide semiconductor layer 114, it is possible to compensate for oxygen defects in the oxide semiconductor layer 114. In this way, the characteristics and the reliability of the transistor are improved.

Figure 2E:
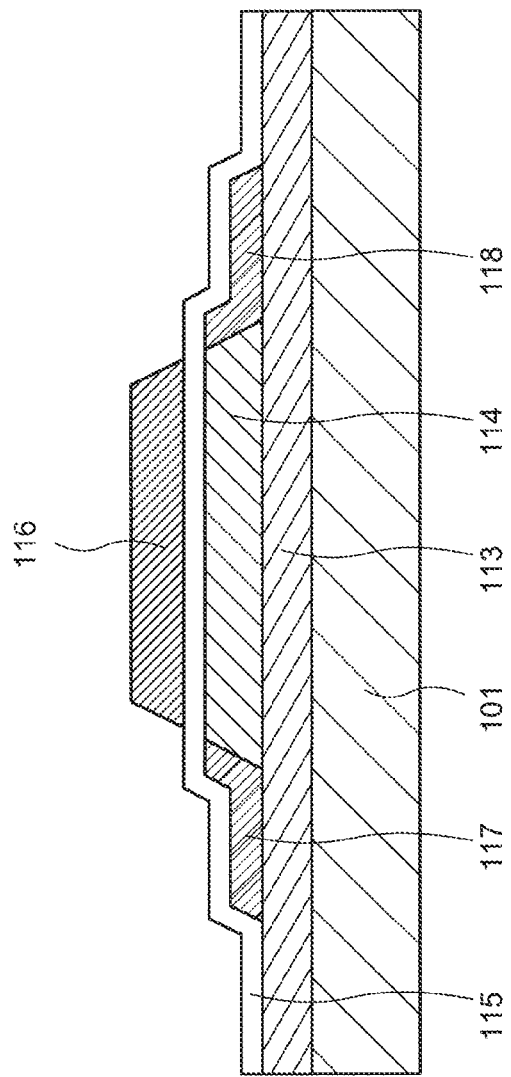
FIG. 2E is a cross-sectional view of a manufacturing method of a semiconductor device related to one embodiment of the present invention.

Next, as shown in FIG. 2E, an insulating layer 115 which functions as a gate insulating film is formed above the oxide semiconductor layer 114, the conducting layer 117 and the conducting layer 118. The insulating layer 115 can be formed having a single layer structure or a stacked layer structure using the materials described above by a CVD method or a sputtering method and the like. In addition, the thickness of the insulating layer 115 can be set to 10 nm or more and 100 nm or less. The concentration of hydrogen included in the insulating layer 115 is preferred to be low. As is shown in FIG. 2E, an upper surface of the oxide semiconductor layer 114, an upper surface of the conducting layer 117 and an upper surface of the conducting layer 118 are planarized. In this way, it is possible to form the insulating layer 115 with good coverage above the oxide semiconductor layer 114, the conducting layer 117 and the conducting layer 118.

Next, the conducting layer 116 is formed above the insulating layer 115 interposed by the insulating layer 115 therebetween. The conducting layer 116 is formed by forming a conductive film and patterning the film to form a desired shape. The conductive film can be formed in a single layer structure or a stacked layer structure by a sputtering method using the materials described above. For example, MoW is used for the conducting layer 116. In addition, the thickness of the conducting layer 116 can be set 15 to 200 nm or more and 500 nm or less. It is preferred that the conducting layer 116 does not overlap with the conducting layer 117 and the conducting layer 118. In this way, it is possible to reduce parasitic capacitance between the conducting layer 116, and the conducting layer 117 and the conducting layer 118.

Figure 2F:
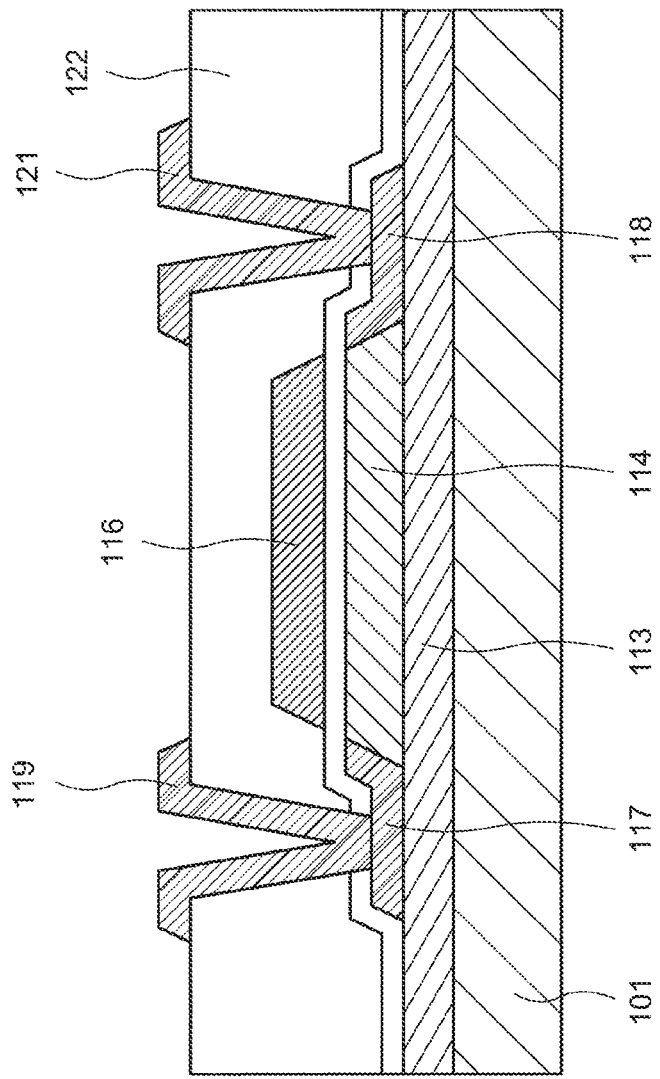
FIG. 2F is a cross-sectional view of a manufacturing method of a semiconductor device related to one embodiment of the present invention.

Next, as is shown in FIG. 2F, the insulating layer 122 is formed above the insulating layer 115 and the conducting layer 116. The insulating layer 122 can be formed having a single layer structure or a stacked layer structure using the materials described above or an organic insulating material such as a polyimide resin, acrylic resin, epoxy resin, silicone resin, fluorine resin or siloxane resin by a CVD method or a sputtering method. In the case where the insulating layer 122 has a stacked layer structure, a silicon oxide film, a silicon nitride film and a silicon oxide film may be stacked in this order, or polyimide may be stacked above the silicon oxide film. In addition, the thickness of the insulating layer 122 can be set to 200 nm or more and 1000 nm or less.

Next, openings are formed in the insulating layer 122 which exposes the conducting layer 117 and the conducting layer 118. Following this, the conducting layer 119 and the conducting layer 121 which are electrically connected to the oxide semiconductor layer 114 are formed. The conducting layer 119 and the conducting layer 121 are formed by forming a conductive film above the insulating layer 122 and patterning the conductive film to form a desired shape. The conductive film can be formed in a single layer structure or a stacked layer structure by a sputtering method using the materials described above. In the case where the conducting layer 119 and the conducting layer 121 are formed in a stacked structure, Ti, Al, and Ti are formed in this order above the insulating layer 122. In addition, the thickness of the conducting layer 119 and the conducting layer 121 can be set to 300 nm or more and 800 nm or less.

In the semiconductor device 100 shown in FIGS. 1A and 1B, the conducting layer 117 and the conducting layer 118 which are in contact with side surfaces of the oxide semiconductor layer 114 and function as a source electrode or a drain electrode are arranged. Specifically, as is shown in FIG. 1B, an end part of the lower surface of the conducting layer 116 matches an end part of the upper surface of the oxide semiconductor layer 114 or is located further inside than the end part of the upper surface of the oxide semiconductor layer 114. In addition, in the conducting layer 117 and the conducting layer 118, the end part of the surface in contact with the oxide semiconductor layer 114 substantially matches the end part of the upper surface of the oxide semiconductor layer 114 or is located in a position lower than the end part on the upper surface of the oxide semiconductor layer 114. In this way, by arranging the conducting layer 116 so as not to overlap the conducting layer 117 and the conducting layer 118, it is possible to reduce parasitic capacitance in the semiconductor device 100. In this way, it is possible to suppress RC delay caused by parasitic capacitance.

In addition, in the insulating layer 115 which functions as a gate insulating film includes a first region in contact with the upper surface of the oxide semiconductor layer 114, a second region in contact with the upper surface of the conducting layer 117, and a third region in contact with the upper surface of the conducting layer 118. The first region, the second region, and the third region have a flat surface. In addition, the upper surface of the oxide semiconductor layer 114, the upper surface of the conducting layer 117 and the upper surface of the conducting layer 118 exist on the same plane. In this way, it is possible to form the insulating layer 115 with good coverage above the oxide semiconductor layer 114, the conducting layer 117 and the conducting layer 118.

In addition, by applying a thermal treatment after patterning the oxide semiconductor layer 114, the end part of the oxide semiconductor layer 114 is put into an oxygen defect state. In this state, by covering the end part of the oxide semiconductor layer 114 with the conducting layer 117 and the conducting layer 118, the supplementation of oxygen to the oxygen defects at the end part of the oxide semiconductor layer 114 is reduced in a subsequent process. In this way, a low resistance region is formed at the end part of the oxide semiconductor layer 114, and it is possible to obtain a good contact between the oxide semiconductor layer 114, and the conducting layer 117 and the conducting layer 118. For example, even when there is an offset region where the oxide semiconductor layer 114 and the conducting layer 116 do not overlap due to patterning of the conducting layer 116, it is possible to secure a current conduction path with no resistance component.

In the case where the oxide semiconductor layer 114 is connected to the source electrode and the drain electrode via openings formed in the insulating layer 122, there is a possibility that the oxide semiconductor layer 114 may disappear when openings are formed in the insulating layer 122. As is shown in the present embodiment, the conducting layer 117 and the conducting layer 118 are arranged in contact with the side surface of the oxide semiconductor layer 114. In addition, openings of the insulating layer 122 is formed so as to expose the conducting layer 117 and the conducting layer 118. In this way, it is possible to prevent the oxide semiconductor layer 114 from disappearing when forming openings in the insulating layer 122.

First Modified Example

Figure 3:
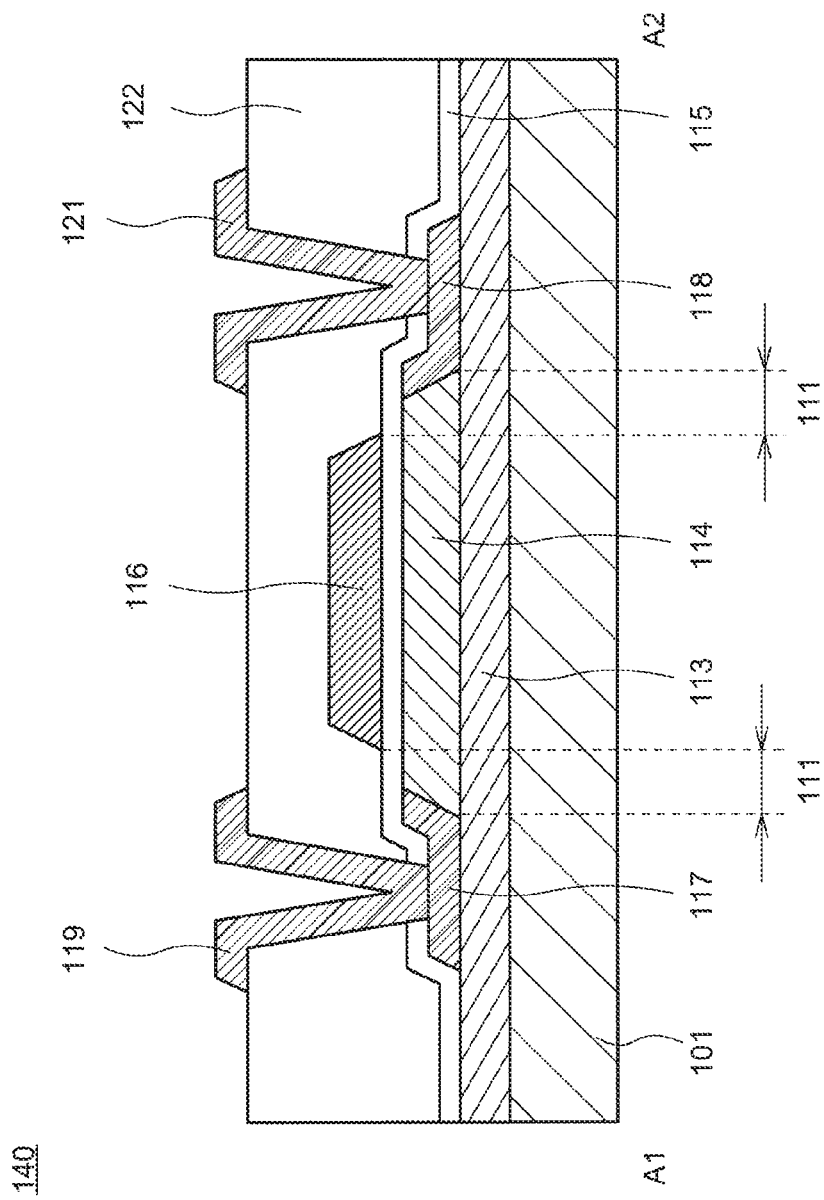
FIG. 3 is a cross-sectional view of a semiconductor device related to one embodiment of the present invention.
Figure 4:
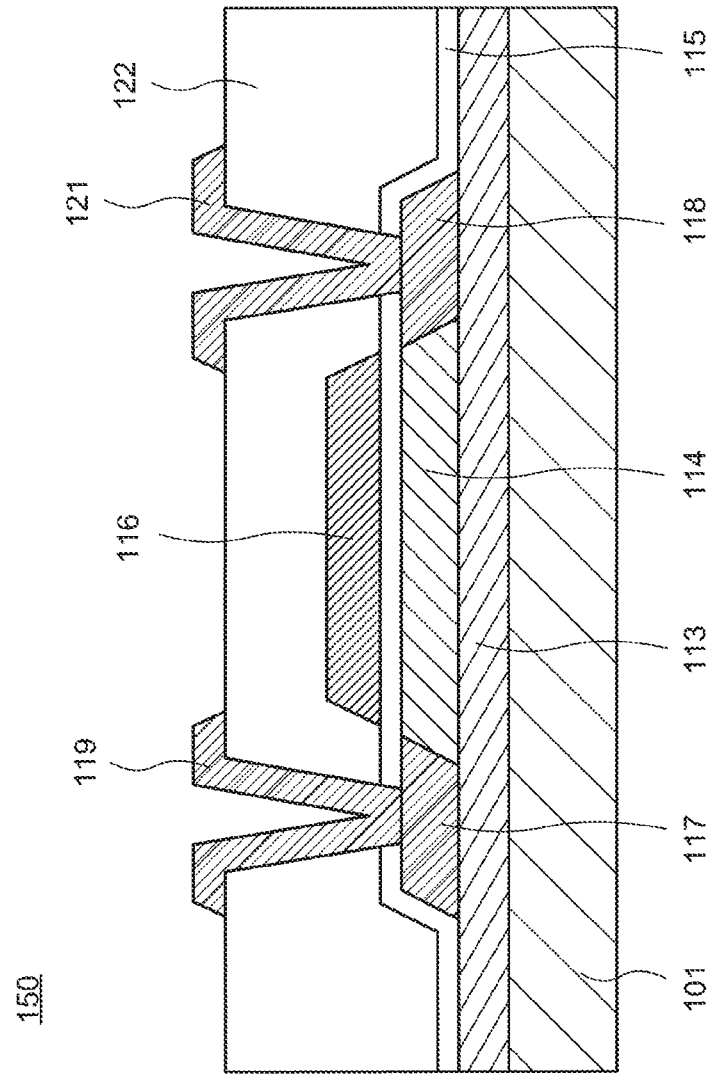
FIG. 4 is a cross-sectional view of a semiconductor device related to one embodiment of the present invention.
Figure 5:
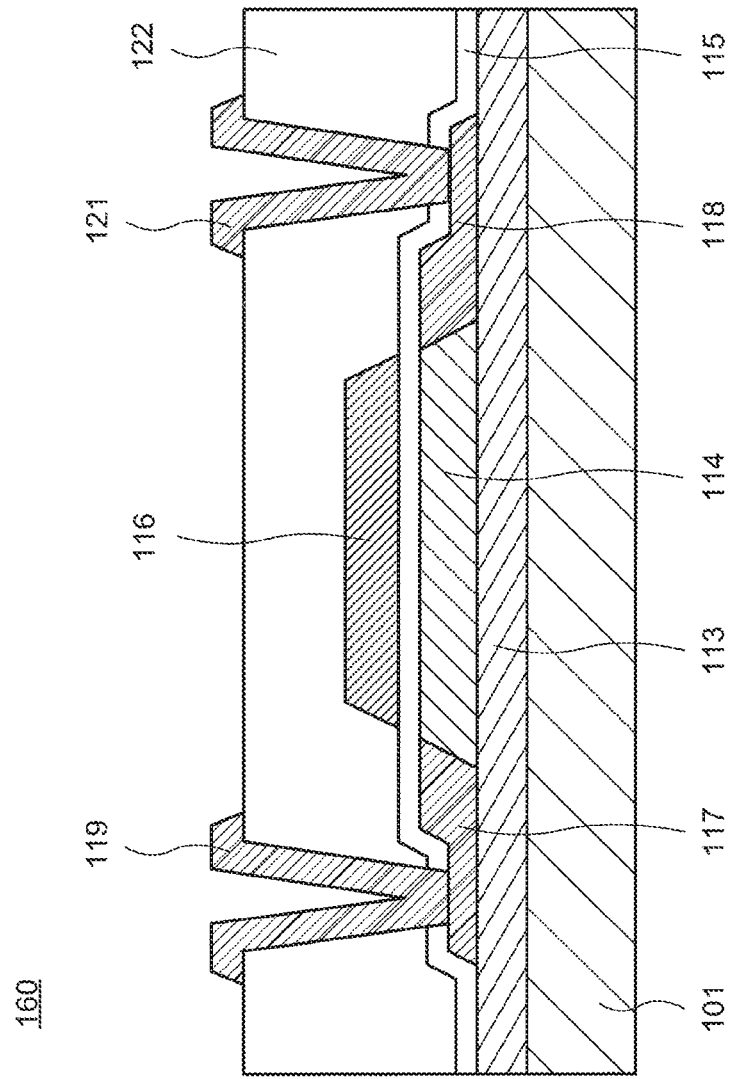
FIG. 5 is a cross-sectional view of a semiconductor device related to one embodiment of the present invention.

Next, a semiconductor device having a partly different structure from the semiconductor device shown in FIG. 1A and FIG. 1B is explained while referring to FIG. 3 to FIG. 5. A detailed explanation of the same structure as the semiconductor device 100 shown in FIG. 1A and FIG. 1B is omitted.

In the semiconductor device 140 shown in FIG. 3, the case where the end part of the lower surface of the conducting layer 116 matches with the end part of the upper surface of the oxide semiconductor layer 114 or is located further inside than the end part of the upper surface of the oxide semiconductor layer 114 is shown. In the oxide semiconductor layer 114, a region which does not overlap with the conducting layer 116, the conducting layer 117, and the conducting layer 118 is called an offset region 111. In the semiconductor device 140 shown in FIG. 3, by applying a thermal treatment after patterning the oxide semiconductor layer 114, the end part of the oxide semiconductor layer 114 is put into an oxygen defect state. In this state, by covering the end part of the oxide semiconductor layer 114 with the conducting layer 117 and the conducting layer 118, supplementation of oxygen to the oxygen defects at the end part of the oxide semiconductor layer 114 is reduced in a subsequent process. In this way, a low resistance region is formed at the end part of the oxide semiconductor layer 114, and it is possible to obtain a good contact between the oxide semiconductor layer 114, and the conducting layer 117 and the conducting layer 118. For example, even when there is an offset region 111 in which the oxide semiconductor layer 114 and the conducting layer 116 do not overlap due to patterning of the conducting layer 116, it is possible to secure a current conduction path with no resistance component.

In the semiconductor device 150 shown in FIG. 4, the film thickness of the oxide semiconductor layer 114 is the same as the film thickness of the conducting layer 117 and the conducting layer 118. In the semiconductor device 150 shown in FIG. 4, after forming the oxide semiconductor layer 114 and forming a conductive film having a larger film thickness than the oxide semiconductor layer 114, the conductive film is polished until the oxide semiconductor layer 114 is exposed. Following this, it is possible to form the conducting layer 117 and the conducting layer 118 by patterning the conductive film.

The semiconductor device 160 shown in FIG. 5 includes a region having the same film thickness as the oxide semiconductor layer 114 in the conducting layers 117 and 118, and a region which has a thinner film thickness than the oxide semiconductor layer 114 in the conducting layers 117 and 118. In addition, in the conducting layer 117 and the conducting layer 118, the conducting layer 119 and the conducting layer 121 are connected in a region where the film thickness is smaller than the film thickness of the oxide semiconductor layer 114. As a formation method of the semiconductor device 160 shown in FIG. 5, the oxide semiconductor layer 114 is formed, a conductive film having a thickness larger than the film thickness of the oxide semiconductor layer 114 is formed and then the conductive film is exposed to the oxide semiconductor layer 114 by applying a polishing process. After this, it is possible to form the conducting layer 117 and the conducting layer 118 having regions with different film thicknesses by patterning the conductive film using a halftone mask.

In the semiconductor device shown in FIG. 3 to FIG. 5, a conducting layer 117 and a conducting layer 118 which are in contact with a side surface of the oxide semiconductor layer 114 and function as a source electrode or a drain electrode are arranged. Specifically, an end part of a lower surface of the conducting layer 116 matches the end part of the upper surface of the oxide semiconductor layer 114 or is located at a position further inside than an end part of the upper surface of the oxide semiconductor layer 114. In addition, in the conducting layer 117 and the conducting layer 118, an end part of the surface in contact with the oxide semiconductor layer 114 substantially matches the end part of the upper surface of the oxide semiconductor layer 114 or is located at lower position than the end part on the upper surface of the oxide semiconductor layer 114. In this way, by arranging the conducting layer 116 to not overlap the conducting layer 117 and the conducting layer 118, it is possible to reduce parasitic capacitance in the semiconductor device 100. In this way, it is possible to suppress RC delay caused by the parasitic capacitance.

In addition, in the insulating layer 115 which functions as a gate insulating film includes a first region in contact with the upper surface of the oxide semiconductor layer 114, a second region in contact with the upper surface of the conducting layer 117, and a third region in contact with the upper surface of the conducting layer 118. The first region, the second region, and the third region have a flat surface. In addition, the upper surface of the oxide semiconductor layer 114, the upper surface of the conducting layer 117 and the upper surface of the conducting layer 118 are on the same plane. In this way, it is possible to form the insulating layer 115 with good coverage above the oxide semiconductor layer 114, the conducting layer 117 and the conducting layer 118.

Second Modified Example

Figure 6:
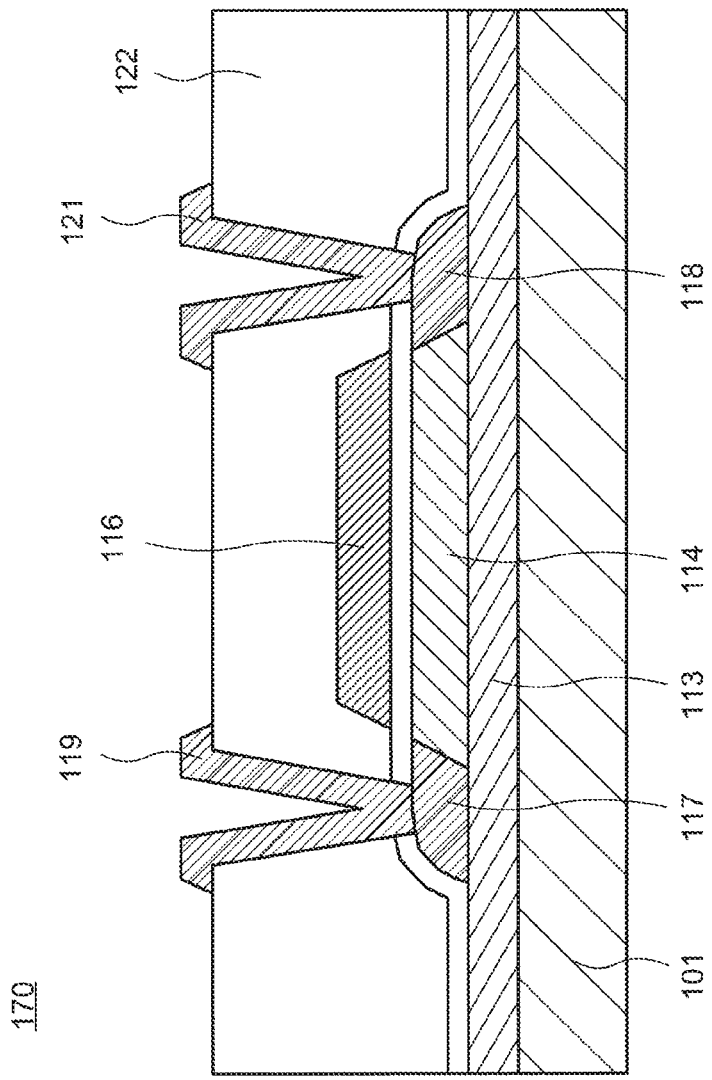
FIG. 6 is a cross-sectional view of a semiconductor device related to one embodiment of the present invention.

Next, a semiconductor device having a partly different structure from the semiconductor device shown in FIG. 1A and FIG. 1B is explained while referring to FIG. 6. A detailed explanation of the same structure as the semiconductor device 100 shown in FIG. 1A and FIG. 1B is omitted.

The semiconductor device 170 shown in FIG. 6 has a shape in which an end part of the conducting layer 117 and the conducting layer 118 are rounded. In the semiconductor device 170 shown in FIG. 5, the conducting layer 117 and the conducting layer 118 which are in contact with a side surface of the oxide semiconductor layer 114 and function as a source electrode or a drain electrode are arranged. Specifically, an end part of the lower surface of the conducting layer 116 matches an end part of the upper surface of the oxide semiconductor layer 114, or is located further inside than the end part of the upper surface of the oxide semiconductor layer 114. In addition, in the conducting layer 117 and the conducting layer 118, the end part of the surface in contact with the oxide semiconductor layer 114 substantially matches the end part of the upper surface of the oxide semiconductor layer 114 or is located in a lower position than the end part on the upper surface of the oxide semiconductor layer 114. In this way, by arranging the conducting layer 116 to not overlap the conducting layer 117 and the conducting layer 118, it is possible to reduce parasitic capacitance in the semiconductor device 100. In this way, it is possible to suppress RC delay caused by the parasitic capacitance.

In the insulating layer 115 which functions as a gate insulating film includes a first region in contact with the upper surface of the oxide semiconductor layer 114, a second region in contact with the upper surface of the conducting layer 117, and a third region in contact with the upper surface of the conducting layer 118. The first region, the second region, and the third region have a flat surface. In addition, the upper surface of the oxide semiconductor layer 114, the upper surface of the conducting layer 117 and the upper surface of the conducting layer 118 are on the same plane. Furthermore, since the end parts of the conducting layer 117 and the conducting layer 118 are rounded, good coverage of the insulating layer 115 which functions as a gate insulating film is obtained and thereby it is possible to reduce the thickness of the insulating layer 115.

Next, a manufacturing method of the semiconductor device 170 shown in FIG. 6 is explained while referring to FIG. 7A to FIG. 7D.

Figure 7A:
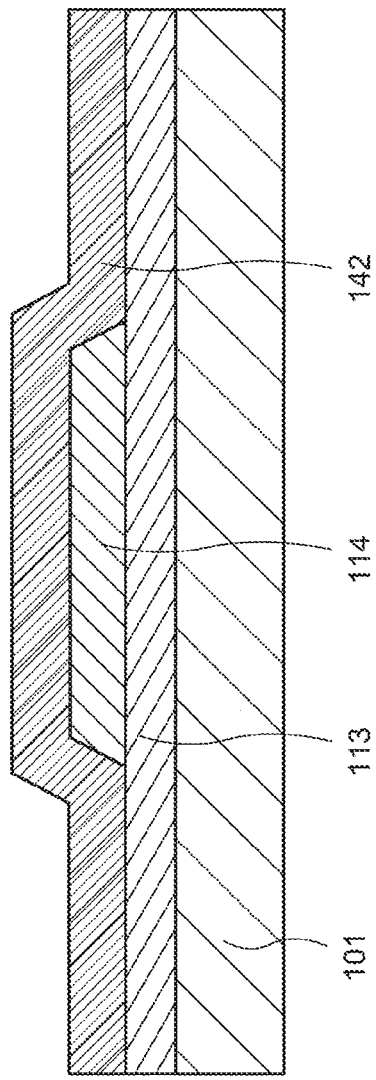
FIG. 7A is a cross-sectional view of a manufacturing method of a semiconductor device related to one embodiment of the present invention.

First, as is shown in FIG. 7A, after an insulating layer 113 which serves as an underlayer is formed above a substrate 101, an oxide semiconductor layer 114 is formed above the insulating layer 113. Next, a conductive film 142 is formed above the oxide semiconductor layer 114. Since the processes from the process of forming the insulating layer 113 above the substrate 101 to the process of forming the conductive film 142 are the same as the processes shown in FIG. 2A and FIG. 2B, a detailed explanation is omitted.

Figure 7B:
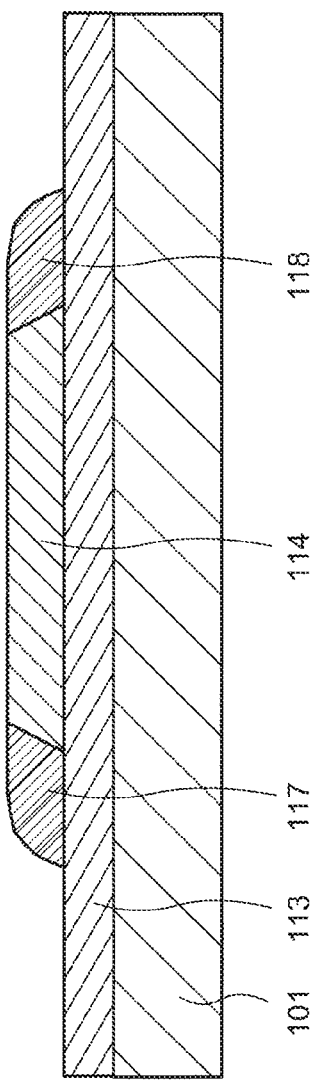
FIG. 7B is a cross-sectional view of a manufacturing method of a semiconductor device related to one embodiment of the present invention.

Next, as is shown in FIG. 7B, a conducting layer 117 and a conducting layer 118 having a rounded shape are formed on a side surface of the oxide semiconductor layer 114. Anisotropic etching is applied to the entire surface of the conductive film 142 to form the conducting layer 117 and the conducting layer 118. By lowering the etching selection ratio between the oxide semiconductor layer 114 and the conductive film 142, it is possible to etch the end parts of the conducting layers 117 and 118 into a rounded shape.

In the case when Ti, Al, and Ti are formed in this order as the conductive film 142, it is possible to use $Cl_2$ or a chlorine based gas such as $Cl_2$ and $BCl_3$ as the type of gas for anisotropic etching. In addition, in the case where the conductive film 142 is formed using W, it is possible to use a fluorine based gas such as $SF_6$ and $O_2$ as the type of gas. In addition, in the case where the conductive film 142 is formed using Mo or MoW, a fluorine based gas such as $SF_6$ and $O_2$ can be used. Furthermore, it is preferred that the temperature of the oxide semiconductor layer 114 during film formation or a thermal treatment is lowered in order to lower the etching selection ratio between the oxide semiconductor layer 114 and the conductive film 142.

Figure 7C:
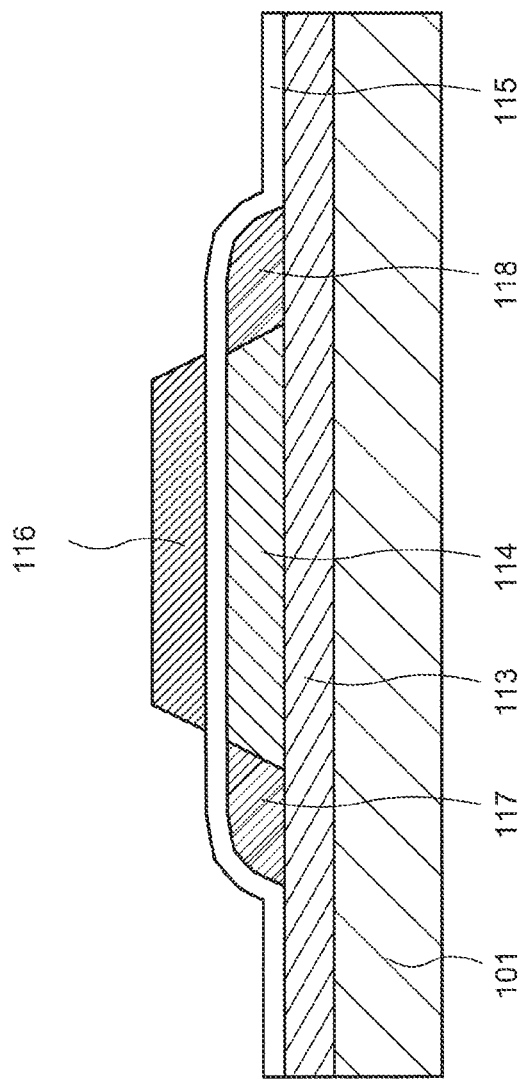
FIG. 7C is a cross-sectional view of a manufacturing method of a semiconductor device related to one embodiment of the present invention.

Next, as is shown in FIG. 7C, an insulating layer 115 which functions as a gate insulating film is formed above the oxide semiconductor layer 114, the conducting layer 117 and the conducting layer 118. Since the end parts of the conducting layer 117 and the conducting layer 118 have a rounded shape, it is possible to obtain good coverage of the insulating layer 115 and thereby it is possible to reduce the thickness of the insulating layer 115.

Next, the conducting layer 116 is formed above the oxide semiconductor layer 114 interposed by the insulating layer 115 therebetween. Since the conducting layer 116 can be formed in the same manner as the process shown in FIG. 2E, a detailed explanation is omitted.

Figure 7D:
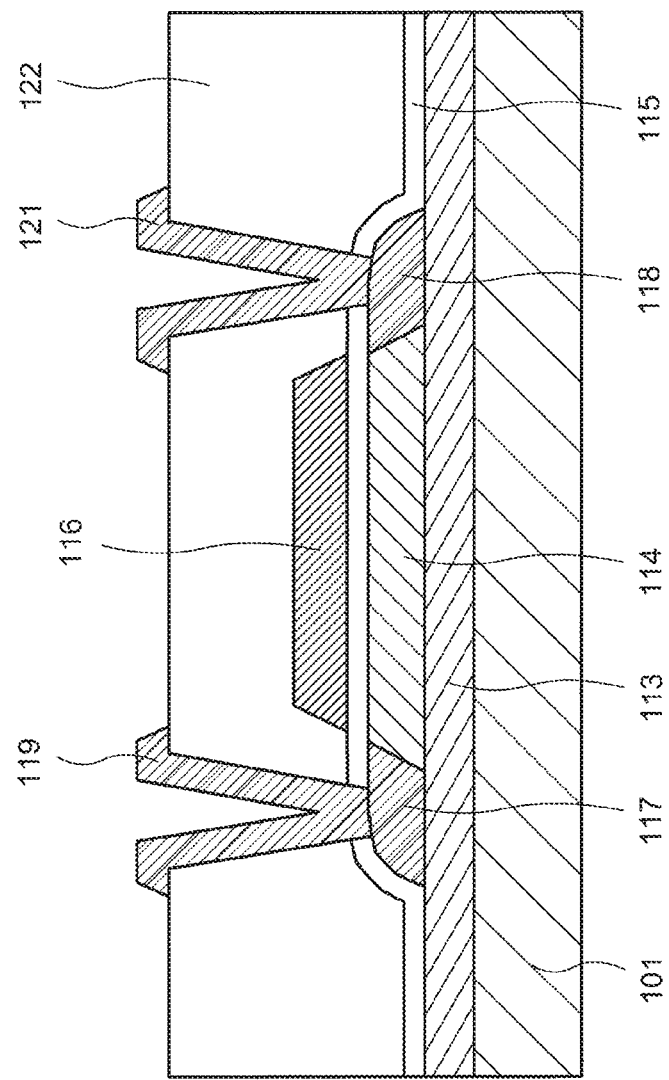
FIG. 7D is a cross-sectional view of a manufacturing method of a semiconductor device related to one embodiment of the present invention.

Next, as is shown in FIG. 7D, after forming the insulating layer 122 above the insulating layer 115 and the conducting layer 116, openings are formed in the insulating layer 122 exposing the conducting layer 117 and the conducting layer 118. Following this, the conducting layer 119 and the conducting layer 121 which are electrically connected to the oxide semiconductor layer 114 are formed. Since the processes from the process of forming the insulating layer 122 to the process of forming the conducting layer 119 and the conducting layer 121 are the same as in FIG. 2F, a detailed explanation is omitted.

Second Embodiment

In the present embodiment, a semiconductor device according to one embodiment of the present invention is explained while referring to FIG. 8A to FIG. 9F. In the present embodiment, the structure of a bottom-gate transistor is explained. In the case when the contents explained in the first embodiment overlap, such an explanation will be omitted as appropriate.

<Structure of Semiconductor Device>

A summary of a semiconductor device 200 according to a second embodiment of the present invention is explained while referring to FIG. 8A and FIG. 8B.

FIG. 8A is a planar diagram of the semiconductor device 200 according to the present embodiment. An oxide semiconductor layer 214, a conducting layer 216, a conducting layer 217 and a conducting layer 218 are shown in FIG. 8A as the semiconductor device 200. In addition, FIG. 8B is a diagram showing a cross-sectional structure of the semiconductor device shown in FIG. 8A cut along the line B1-B2. A substrate 101, an insulating layer 113, a conducting layer 216, an insulating layer 215, an oxide semiconductor layer 214, a conducting layer 217, a conducting layer 218, an insulating layer 222, a conducting layer 219 and a conducting layer 221 are shown in FIG. 8B as the semiconductor device 200.

The conducting layer 216 functions as a gate electrode. A material similar to that of the conducting layer 116 can be used for the conducting layer 216. In addition, the conducting layer 216 may have a single layer structure or a stacked layer structure.

The insulating layer 215 functions as a gate insulating film. A material similar to that of the insulating layer 115 can be used for the insulating layer 215. In addition, the insulating layer 215 may have a single layer structure or a stacked layer structure.

A material similar to that of the oxide semiconductor layer 114 can be used for the oxide semiconductor layer 214. In addition, the conducting layer 217 and the conducting layer 218 function as a source electrode or a drain electrode. The conducting layer 217 and the conducting layer 218 are arranged in contact with a side surface of the oxide semiconductor layer 114. In addition, the conducting layer 217 and the conducting layer 218 are arranged so as not to overlap with the conducting layer 216. Materials similar to those of the conducting layer 117 and the conducting layer 118 can be used for the conducting layer 217 and the conducting layer 218. In addition, the conducting layer 217 and the conducting layer 218 may have a single layer structure or a stacked layer structure.

The insulating layer 222 functions as a protective film. A material similar to that of the insulating layer 122 can be used for the insulating layer 222. In addition, the insulating layer 222 may have a single layer structure or a stacked layer structure.

The conducting layer 219 and the conducting layer 221 function as wiring. The conducting layer 219 and the conducting layer 221 are each connected to the conducting layer 217 and the conducting layer 218 respectively through openings formed in the insulating layer 222. The conducting layer 219 and the conducting layer 221 can be formed using the same materials as the conducting layer 217 and conducting layer 218. In addition, the conducting layer 219 and the conducting layer 221 may have a single layer structure or a stacked layer structure.

Similar to the semiconductor device explained in the first embodiment, the semiconductor device 200 shown in FIG. 8A and FIG. 8B is arranged with a conducting layer 217 which is in contact with a side surface of the oxide semiconductor layer 214 and functions as a source electrode or a drain electrode, and a conducting layer 218. Specifically, an end part of the lower surface of the conducting layer 216 matches an end part of the upper surface of the oxide semiconductor layer 214 or is located further inside than the end part of the upper surface of the oxide semiconductor layer 214. What is meant by substantially matching here is that the end part of the lower surface of the conducting layer 216 can be said to substantially match as long as it is in the range of approximately ±10 nm from the end part of the upper surface of the oxide semiconductor layer 214.

In addition, the film thickness of the oxide semiconductor layer 214 is the same as the film thickness of the conducting layer 217 and the conducting layer 218. Specifically, in the conducting layer 217 and the conducting layer 218, the end part of the surface in contact with the oxide semiconductor layer 214 substantially matches the end part of the upper surface of the oxide semiconductor layer 214 or is in a lower position than an end part of the upper surface of the oxide semiconductor layer 214. Furthermore, substantially matching means for example, that as long as the end parts of the conducting layer 217 and the conducting layer 218 are located at a higher position by 1 nm to 10 nm than the end part of the upper surface of the oxide semiconductor layer 214. In this way, by arranging the conducting layer 217 and the conducting layer 218 so as not to overlap with the conducting layer 216, it is possible to reduce parasitic capacitance in the semiconductor device 200. In this way, it is possible to suppress RC delay which is caused by the parasitic capacitance.

In addition, the upper surface of the oxide semiconductor layer 114 the upper surface of the conducting layer 217 and the upper surface of the conducting layer 218 have a flat surface. In addition, the upper surface of the oxide semiconductor layer 114, the upper surface of the conducting layer 117 and the upper surface of the conducting layer 118 are on the same plane. In this way, it is possible to planarize the surface of the insulating layer 222 which is arranged above the oxide semiconductor layer 214. In addition, since it is possible to reduce shape unevenness caused by the oxide semiconductor layer 214, the conducting layer 218 and the conducting layer 217, it is possible to increase the film thickness uniformity of the insulating layer 222. Further, it is possible to arrange the insulating layer 222 having good coverage at the end parts of the conducting layer 217 and the conducting layer 218.

<Manufacturing Method of Semiconductor Device>

Next, manufacturing a method of the semiconductor device 200 according to the present embodiment is explained while referring to FIG. 9A to FIG. 9F.

Figure 9A:
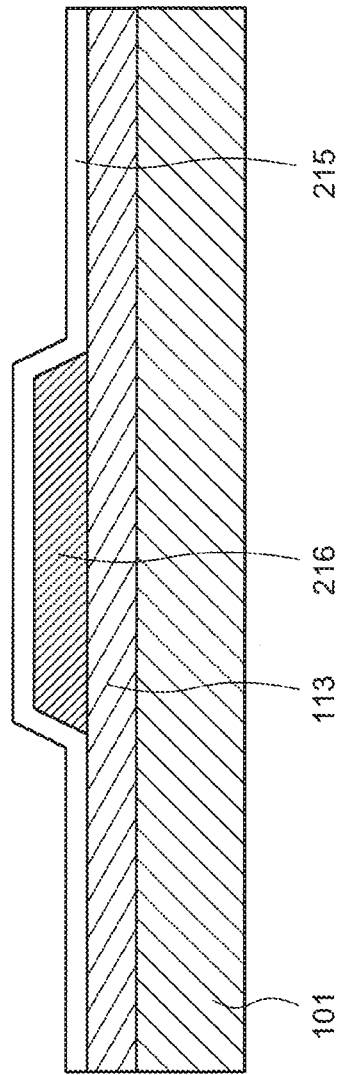
FIG. 9A is a cross-sectional view of a manufacturing method of a semiconductor device related to one embodiment of the present invention.

First, as is shown in FIG. 9A, an insulating layer 113 which functions as an underlayer film is formed above a substrate 101. The insulating layer 113 can be formed to have a single layer structure or a stacked layer structure by using the materials described above by a CVD method, a sputtering method or a lamination method and the like. The film thickness of the insulating layer 113 can be set to 50 nm or more and 1000 nm or less.

Next, a conducting layer 216 which functions as a gate electrode is formed above the insulating layer 113. The conducting layer 216 is formed by forming a conductive film and then patterning the conductive film to form a desired shape. The conductive film can be formed in a single layer structure or a stacked layer structure by a sputtering method using the materials described above. In addition, it is preferred that the thickness of the conducting layer 216 is 200 nm or more and 500 nm or less. Next, an insulating layer 215 which functions as a gate insulating film is formed above the conducting layer 216. The insulating layer 215 can be formed in a single layer structure or a stacked layer structure using the materials described above by a CVD method or a sputtering method. It is preferred that the film thickness of the insulating layer 215 is 100 nm or more and 300 nm or less.

Figure 9B:
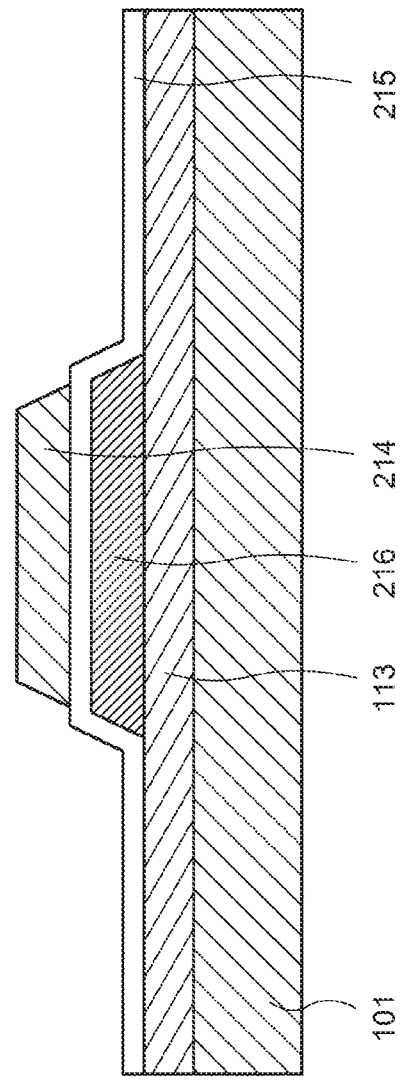
FIG. 9B is a cross-sectional view of a manufacturing method of a semiconductor device related to one embodiment of the present invention.

Next, as is shown in FIG. 9B, an oxide semiconductor layer 214 is formed above the insulating layer 215. The oxide semiconductor layer 214 is formed by forming the oxide semiconductor film and then processing the oxide semiconductor film into a desired shape by patterning. It is preferred to form the oxide semiconductor film by a sputtering method for example, with a film thickness of 30 nm or more and 100 nm or less.

Furthermore, a plasma treatment may be applied to the oxide semiconductor layer 214. The plasma treatment may be applied after the oxide semiconductor film 241 is formed or after patterning of the oxide semiconductor layer 214. Oxide defects may occur in the oxide semiconductor film 241 by applying a polishing treatment or patterning the oxide semiconductor film 241. As a result, it is preferred to apply a plasma treatment after patterning the oxide semiconductor film 241. The plasma treatment can be applied at atmospheric pressure plasma or low pressure (vacuum) using $O_2$ gas or $N_2O$ gas. By applying a plasma treatment on the oxide semiconductor layer 214, it is possible to compensate for oxygen defects in the oxide semiconductor layer 214. In this way, the characteristics and reliability of the transistor are improved.

Figure 9C:
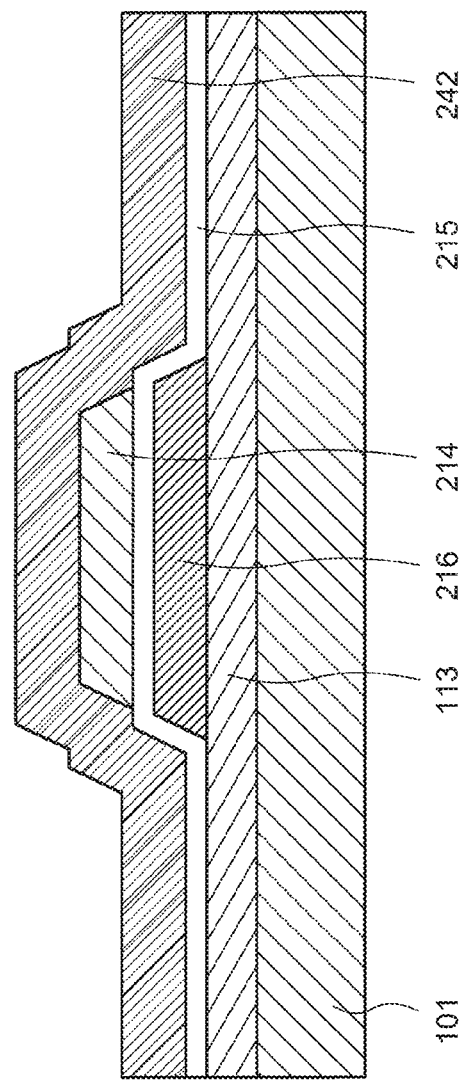
FIG. 9C is a cross-sectional view of a manufacturing method of a semiconductor device related to one embodiment of the present invention.

Next, as is shown in FIG. 9C, a conductive film 242 is formed above the oxide semiconductor layer 214. The conductive film 242 can be formed with a single layer structure or a stacked layer structure by a sputtering method using the materials described above. In addition, the film thickness of the conductive film 242 is formed larger than the film thickness of the oxide semiconductor layer 214.

Figure 9D:
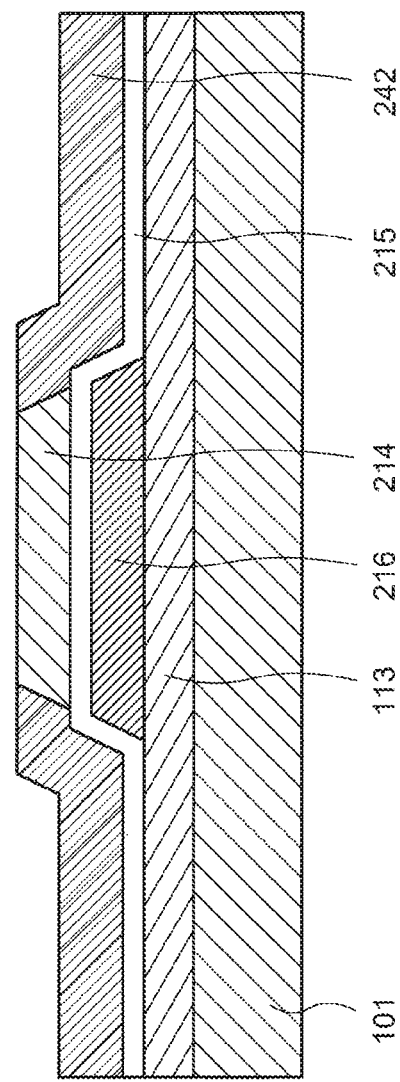
FIG. 9D is a cross-sectional view of a manufacturing method of a semiconductor device related to one embodiment of the present invention.

Next, as is shown in FIG. 9D, by applying chemical mechanical polishing on the conductive film 242, the upper surface of the oxide semiconductor layer 214 is exposed. By applying chemical mechanical polishing on the conductive film 242, it is possible to planarize the top surface of the oxide semiconductor layer 214 and the top surface of the conductive film 242.

Figure 9E:
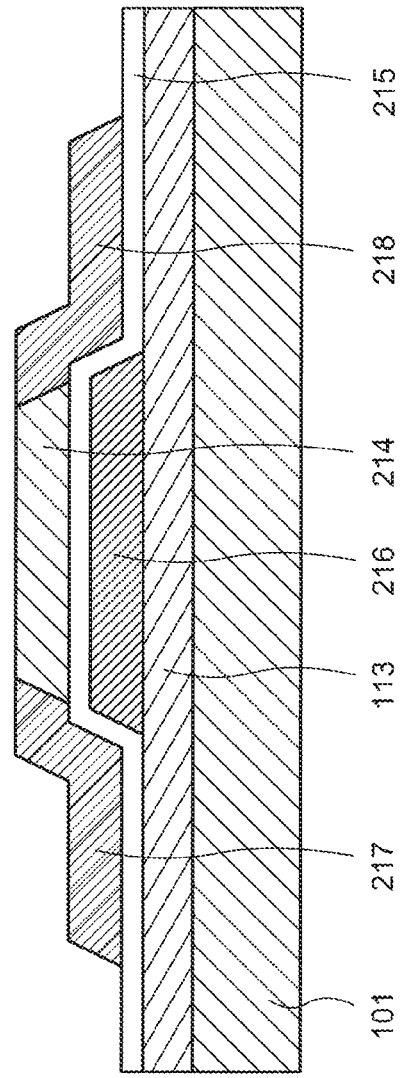
FIG. 9E is a cross-sectional view of a manufacturing method of a semiconductor device related to one embodiment of the present invention.

Next, as is shown in FIG. 9E, by patterning the conductive film 142, the conducting layer 217 and the conducting layer 218 which function as a source electrode or drain electrode are formed.

Next, as is shown in FIG. 9F, the insulating layer 222 is formed above the oxide semiconductor layer 214, the conducting layer 217 and the conducting layer 218. The insulating layer 222 can be formed with a single layer structure or a stacked layer structure by using the materials described above, or by an organic insulating material such as a polyimide resin, acrylic resin, epoxy resin, silicone resin, fluorine resin or siloxane resin by a CVD method or sputtering method. In addition, the film thickness of the insulating layer 222 can be set to 200 nm or more and 1000 nm or less.

Next, openings are formed in the insulating layer 222 which exposes the conducting layer 217 and the conducting layer 218. Following this, the conducting layer 219 and the conducting layer 221 which are electrically connected to the conducting layer 217 and the conducting layer 218 are formed. The conducting layer 219 and the conducting layer 221 are formed by forming a conductive film above the insulating layer 222 and patterning the conductive film to form a desired shape. The conductive film can be formed in a single layer structure or a stacked layer structure by a sputtering method using the materials described above. In addition, it is preferred that the film thicknesses of the conducting layer 219 and the conducting layer 221 are thicker than the oxide semiconductor layer 214 and can be set to, for example, 300 nm or more and 800 nm or less.

Similar to the semiconductor device explained in the first embodiment, the semiconductor device 200 shown in FIG. 8 is arranged with the conducting layer 217 and the conducting layer 218 which functions as a source electrode or a drain electrode in contact with a side surface of the oxide semiconductor layer 214. Specifically, an end part of the lower surface of the conducting layer 216 matches an end part of the upper surface of the oxide semiconductor layer 214 or is located further inside than the end part of the upper surface of the oxide semiconductor layer 214. In addition, in the conducting layer 217 and the conducting layer 218, an end part of the surface in contact with the oxide semiconductor layer 214 substantially matches the end part of the upper surface of the oxide semiconductor layer 214, or is located in a lower position than the end part on the upper surface of the oxide semiconductor layer 214. In this way, by arranging the conducting layer 217 and the conducting layer 218 so as not to overlap with the conducting layer 216, it is possible to reduce parasitic capacitance in the semiconductor device 200. In this way, it is possible to suppress RC delay caused by the parasitic capacitance.

In addition, the upper surface of the oxide semiconductor layer 214, the upper surface of the conducting layer 217 and the upper surface of the conducting layer 218 have a flat surface. In addition, the upper surface of the oxide semiconductor layer 214, the upper surface of the conducting layer 217 and the upper surface of the conducting layer 218 are on the same plane. In this way, it is possible to planarize the surface of the insulating layer 222 which is arranged above the oxide semiconductor layer 214. In addition, it is possible to reduce shape unevenness caused by the oxide semiconductor layer 214, the conducting layer 218 and the conducting layer 217, thereby it is possible to increase the thickness uniformity of the insulating layer 222. Furthermore, it is possible to arrange the insulating layer 222 having good coverage at the end parts of the conducting layer 217 and the conducting layer 218.

In the process shown in FIG. 9C, in the case where the source electrode and the drain electrode are formed by patterning the conductive film 242, there is a possibility that the upper surface of the oxide semiconductor layer 214 is slightly removed by an etching gas. In this way, since the characteristics of the transistor fluctuate, reliability may decrease.

In the present embodiment, after polishing the conductive film 242 until the oxide semiconductor layer 214 is exposed, a mask is formed over the oxide semiconductor layer 214 and the conductive film 242 is patterned. As a result, the surface of the oxide semiconductor layer 214 is not exposed to to an etching gas. Therefore, since it is possible to suppress a fluctuation in characteristics of the transistor, it is possible to improve reliability.

In addition, by applying a thermal treatment after patterning the oxide semiconductor layer 214, the end part of the oxide semiconductor layer 214 is put in an oxygen defective state. In this state, by covering the end part of the oxide semiconductor layer 214 with the conducting layer 217 and the conducting layer 218, supplementation of oxygen to the oxygen defects at the end part of the oxide semiconductor layer 214 is reduced in a subsequent process. In this way, a low resistance region is formed at the end part of the oxide semiconductor layer 214, and it is possible to obtain good contact between the oxide semiconductor layer 214 and the conducting layer 217 and the conducting layer 218. For example, it is possible to secure a current conduction path with no resistance component even when there is an offset region where the oxide semiconductor layer 214 and the conducting layer 216 do not overlap due to patterning of the conducting layer 216.

Third Embodiment

In the present, an example in which the structure of the semiconductor device described in the first embodiment and the second embodiment is applied to a display device is shown.

<Structure of Display Device>

Figure 10:
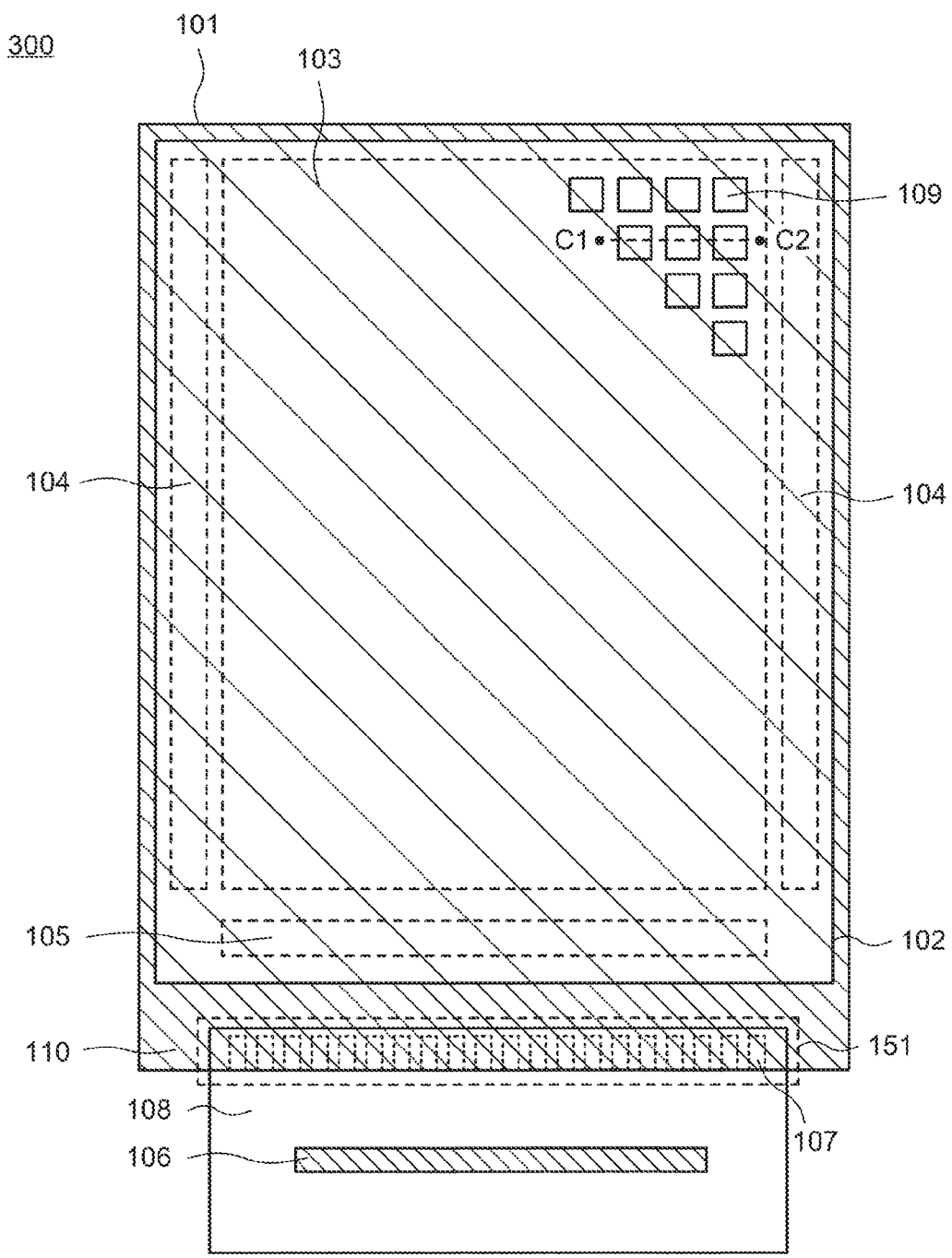
FIG. 10 is a planar view of a display device related to one embodiment of the present invention.

FIG. 10 is a schematic diagram showing a structure of a display device 300 according to one embodiment of the present invention, and shows a schematic structure when the display device 300 is viewed in a planar view. In the present specification, a state in which the display device 300 is viewed from a direction perpendicular to the screen (display region) is called a "planar view".

As is shown in FIG. 10, the display device 300 includes a display region 103, a scanning line drive circuit 104, a data line drive circuit 105 and a driver IC 106 formed on an insulating surface. The driver IC 106 functions as a control part which provides signals to the scanning line drive circuit 104 and the data line drive circuit 105. The data line drive circuit 105 may be incorporated within the driver IC 106. In addition, although the driver IC 106 is externally arranged on a flexible printed substrate 108, the driver IC 106 may also be arranged on the substrate 101. The flexible printed substrate 108 is connected to a terminal 107 arranged in a periphery area 110.

Here, the insulating surface is the surface of the substrate 101. The substrate 101 supports each layer which forms a transistor or a light emitting element and the like arranged on the surface of the substrate. In the present embodiment, a foldable substrate is used as the substrate 101. An organic resin material such as polyimide, acrylic, epoxy, polyethylene terephthalate or the like can be used as the substrate 101.

A plurality of pixels 109 are arranged in a matrix shape in the display region 103 shown in FIG. 10. Each pixel 109 includes a liquid crystal element and a light emitting element as a display element. In the present embodiment, a case where a light emitting element is used is explained. The light emitting element includes a pixel electrode (anode), an organic layer (light emitting part) including a light emitting layer stacked on the pixel electrode, and a counter electrode (cathode). A data signal corresponding to image data is provide to each pixel 109 from the data line drive circuit 105. According to these data signals, a transistor electrically connected to the pixel electrode arranged provided in each pixel 109 is driven to display a screen according to the image data.

Here, it is possible to use the transistors shown in the first embodiment and the second embodiment for the display region 103, the scanning line drive circuit 104 and the data line drive circuit 105. In the present embodiment, a case where the transistor shown in FIG. 1A and FIG. 1B is used as the transistor 180 is shown.

<Pixel Structure>

Figure 11:
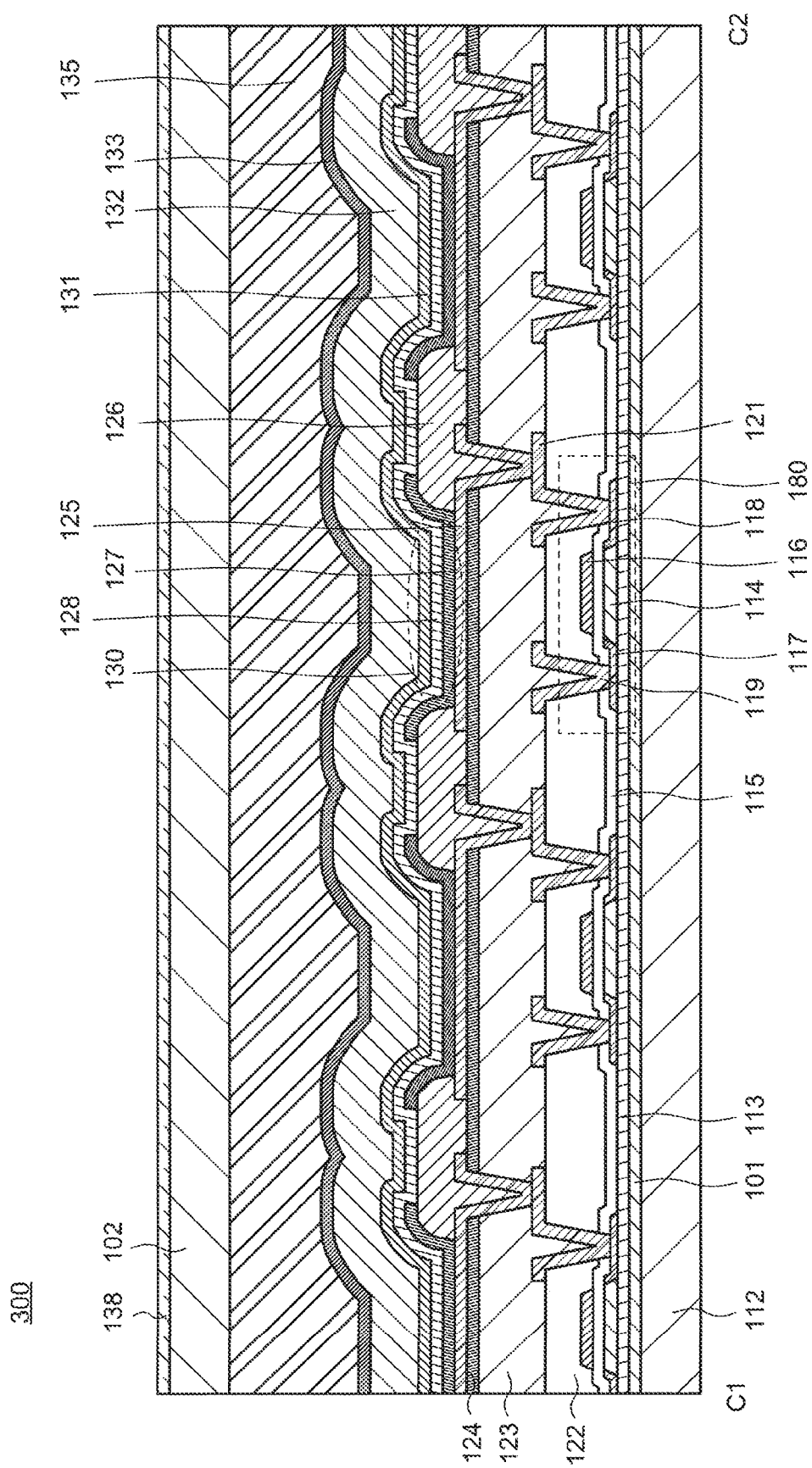
FIG. 11 is a cross-sectional view of a display device related to one embodiment of the present invention.

FIG. 11 is a diagram showing an example of a structure of a pixel in the display device 300 of the present embodiment. Specifically, FIG. 11 is a diagram showing a structure of a cross-section of the display region 103 shown in FIG. 10 cut along the line C1-C2. FIG. 11 shows a cross-section of three display elements as a part of the display region 103. Although three display elements are shown in FIG. 11, actually, more than several million display elements are arranged in a matrix corresponding to the pixels in the display region 103.

As is shown in FIG. 11, the display device 300 includes a substrate 101, a protective film 112 and a protective film 102. A glass substrate, a quartz substrate, a flexible substrate (polyimide, polyethylene terephthalate, polyethylene naphthalate, triacetyl cellulose, cyclic olefin copolymer, cycloolefin polymer, or other resin substrate having flexibility) can be used as the substrate 101, the protective film 112 and the protective film 102. In the case when it is not necessary for the substrate 101, the protective film 112 and the protective film 102 to have translucency, it is also possible to use a metal substrate, a ceramic substrate or a semiconductor substrate. In the present embodiment, a case where polyimide is used as the substrate 101 and polyethylene terephthalate is used as the protective film 112 and the protective film 102 is explained.

An insulating layer 113 is arranged above the substrate 101. The insulating layer 113 may be appropriately determined while considering adhesion to the substrate 101 and barrier properties to the transistor 180 described herein.

A transistor 180 is arranged above the insulating layer 113. The structure of the transistor 180 may be a top gate type or a bottom gate type structure. In the present embodiment, the transistor 180 includes the oxide semiconductor layer 114 arranged above the insulating layer 113, the insulating layer 115 covering the oxide semiconductor layer 114, and the conducting layer 116 arranged above the insulating layer 115. In addition, the insulating layer 122 which covers the conducting layer 116, and the conducting layer 117 and the conducting layer 118 which are arranged above over the insulating layer 122 and are respectively connected to the oxide semiconductor layer 114 are arranged above the transistor 180.

Furthermore, although not shown in FIG. 11, it is possible to arrange a first wiring formed from the same metal material as the metal material forming the conducting layer 116 in the same layer as the conducting layer 116. For example, the first wiring can be arranged as a scanning driven by the scanning line drive circuit 104. Although not shown in FIG. 11, it is possible to arrange a second wiring extending in a direction intersecting the first wiring in the same layer as the conducting layer 117 and the conducting layer 118. For example, the second wiring can be arranged as a data line driven by the data line drive circuit 105.

A planarization film 123 is arranged above the transistor 180. The planarization film 123 is formed including an organic resin material. For example, known organic resin materials such as polyimide, polyamide, acrylic, epoxy and the like can be used as the organic resin material. These materials can form a film by a solution coating method and have a high flattening effect. Although not specifically shown in the diagram, the planarization film 123 is not limited to a single layer structure and may have a stacked layer structure of a layer containing an organic resin material and an inorganic insulating layer.

The planarization film 123 includes a contact hole which exposes a part of the conducting layer 118. The contact hole is an opening for electrically connecting a pixel electrode 125 and the conducting layer 118 described herein. Therefore, the contact hole is arranged to overlap a part of the conducting layer 118. The conducting layer 118 is exposed at the bottom surface of the contact hole.

A protective film 124 is arranged above the planarization film 123. The protective film 124 overlaps the contact hole formed in the planarizing film 123. The protective film 124 is preferred to have a barrier function against moisture and oxygen, and is formed, for example, using an inorganic insulating material such as a silicon nitride film or aluminum oxide.

The pixel electrode 125 is arranged above the protective film 124. The pixel electrode 125 overlaps the contact hole of the planarization film 123 and the protection film 124 and is electrically connected to the source electrode or the conducting layer 118 exposed at the bottom surface of the contact hole. In the display device 300 of the present embodiment, the pixel electrode 125 functions as an anode which forms the light emitting element 130. The pixel electrode 125 has a different structure depending on whether it is a top emission type or a bottom emission type. For example, in the case of a top emission type, a metal film having high reflectance is used as the pixel electrode 125 or a stacked layer structure of a metal film and a transparent conducting layer having a high work function such as an indium oxide type transparent conducting layer (for example, ITO) or a zinc oxide type transparent conducting layer (for example, IZO, ZnO). On the other hand, in the case of a bottom emission type, the transparent conducting layer described above is used as the pixel electrode 125. In the present embodiment, a top emission type organic EL display device is explained as an example. The end part of the pixel electrode 125 is covered by an insulating layer 126 described herein.

An insulating layer 126 formed from an organic resin material is arranged above the pixel electrode 125. A known resin material such as polyimide, polyamide, acrylic, epoxy or siloxane can be used as the organic resin material. The insulating layer 126 has an opening in a part of the pixel electrode 125. The insulating layer 126 is arranged to cover an end part (edge part) of the pixel electrode 125 between adjacent pixel electrodes 125, and functions as a member separating adjacent pixel electrodes 125. As a result, the insulating layer 126 is also generally called a "partition wall" or a "bank". A part of the pixel electrode 125 which is exposed from the insulating layer 126 is a light emitting region of the light emitting element 130. It is preferred that the inner wall of the opening part of the insulating layer 126 has a tapered shape. In this way, it is possible to reduce coverage defects at the end part of the pixel electrode 125 at the time of forming a light emitting layer described herein. The insulating layer 126 not only covers the end part of the pixel electrode 125 but may also function as a filling material which fills a concave part caused by the contact hole of the planarization film 123 and the protective film 124.

The organic layer 127 is arranged above the pixel electrode 125. The organic layer 127 has at least a light emitting layer formed from an organic material and functions as a light emitting part of the light emitting element 130. In addition to the light emitting layer, the organic layer 127 may include various charge transport layers such as an electron injection layer, an electron transport layer, a hole injection layer and a hole transport layer. The organic layer 127 is arranged covering a light emitting region, that is, to cover an opening part of the insulating layer 126 and an opening part of the insulating layer 126 in the light emitting region.

Furthermore, in the present embodiment, by arranging a light emitting layer which emits light of a desired color in the organic layer 127 and forming the organic layer 127 having different light emitting layers on each pixel electrode 125, a structure which displays each color of RGB is obtained. That is, in the present embodiment, the light emitting layer of the organic layer 127 is discontinuous between adjacent pixel electrodes 125. In addition, various charge transport layers are continuous between adjacent pixel electrodes 125. A known structure or a known material can be used for the organic layer 127 and is not particularly limited to the structure of the present embodiment. In addition, the organic layer 127 has a light emitting layer which emits white light and each color of RGB may be displayed through a color filter. In this case, the organic layer 127 can also be arranged above the insulating layer 126.

The counter electrode 128 is arranged above the organic layer 127 and the insulating layer 126. The counter electrode 128 functions as a cathode which forms the light emitting element 130. Since the display device 300 of the present embodiment is a top emission type, a transparent electrode is used as the counter electrode 128. An MgAg thin film or a transparent conducting layer (ITO or IZO) is used as the thin film for forming the transparent electrode. The counter electrode 128 is also arrange above the insulating layer 126 across respective pixels 109. The counter electrode 128 is electrically connected to an external terminal via a lower conducting layer in the periphery region in the vicinity of the end part of the display region 103. As described above, in the present embodiment, the light emitting element 130 is formed by a part of the pixel electrode 125 (anode) exposed from the insulating layer 126, the organic layer 127 (light emitting part) and the counter electrode 128 (cathode).

As is shown in FIG. 11, the first inorganic insulating layer 131, the organic insulating layer 132 and the second inorganic insulating layer 133 are arranged above the display region 103. The first inorganic insulating layer 131, the organic insulating layer 132 and the second inorganic insulating layer 133 function as a sealing film for preventing moisture and oxygen from entering the light emitting element 130. By arranging the sealing film on the display region 103, it is possible to prevent moisture and oxygen from entering the light emitting element 130, and it is possible to improve the reliability of the display device. A film of silicon nitride ($SixNy$), silicon oxynitride ($SiOxNy$), silicon nitride oxide ($SiNxOy$), aluminum oxide ($AlxOy$), aluminum nitride ($AlxNy$), aluminum oxynitride ($AlxOy Nz$)) and aluminum nitride oxide ($AlxNyOz$) or the like can be used as the first inorganic insulating layer 131 and the second inorganic insulating layer 133 (x, y, z are arbitrary). A polyimide resin, an acrylic resin, an epoxy resin, a silicone resin, a fluororesin, a siloxane resin or the like can be used as the organic insulating layer 132. In addition, $SiwAlx OyNz$ in which $SiNx$ and $AlOx$ are compounded can be used as the first inorganic insulating layer 131 and the second inorganic insulating layer 133.

An adhesive material 135 is arranged above the second inorganic insulating layer 133. For example, an acrylic type, rubber type, silicone type or urethane type adhesive material can be used as the adhesive material 135. In addition, the adhesive material 135 may include moisture absorbing substances such as calcium and zeolite. By including a moisture absorbing substance in the adhesive material 135, even when moisture enters into the display device 300, it is possible to delay the arrival of moisture to the light emitting element 130. A spacer may also be arranged above the adhesive material 135 to secure a gap between the substrate 101 and the protective film 102. This type of spacer may be mixed with the adhesive material 135 or may be formed of a resin above the substrate 101.

For example, an overcoat layer may also be provided for planarization in the protective film 102. When the organic layer 127 emits white light, a color filter corresponding to each color of RGB and a black matrix arranged between the color filters are formed on a main surface (surface facing the substrate 101) in the protective film 102. In the case when a color filter is not formed on the protective film 102 side, for example, a color filter may be formed directly on the sealing film and the adhesive 135 may be formed thereupon. A polarization plate 138 is arranged on a rear surface (display surface side) of the protective film 102.

In the transistor explained in the previous embodiments, the conducting layer 117 and the conducting layer 118 are arranged in contact with a side surface of the oxide semiconductor layer 114. In addition, the conducting layer 116 which functions as a gate electrode and the conducting layer 117 and the conducting layer 118 which serve as a source electrode and a drain electrode are arranged to not overlap with each other. Specifically, the end part of the lower surface of the conducting layer 116 matches the end part of the upper surface of the oxide semiconductor layer 114 or is located further inside than the end part of the upper surface of the oxide semiconductor layer 114. In addition, in the conducting layer 117 and the conducting layer 118, the end part of the surface in contact with the oxide semiconductor layer 114 substantially matches the end part of the upper surface of the oxide semiconductor layer 114 or is located in a lower position than the end part of the upper surface of the oxide semiconductor layer 114. In this way, it is possible to reduce parasitic capacitance caused by overlapping wiring. In addition, it is possible to suppress RC delay caused by parasitic capacitance. In addition, by using the transistor, it is possible to accelerate circuit operation and manufacture a display device with improved display performance.

In the insulating layer 115 which functions as a gate insulating film includes the first region in contact with the upper surface of the oxide semiconductor layer 114, the second region in contact with the upper surface of the conducting layer 117, and the third region in contact with the upper surface of the conducting layer 118. The first region, the second region, and third region have a flat surface. In this way, it is possible to arrange the insulating layer 115 having good coverage above the oxide semiconductor layer 114, the conducting layer 117 and the conducting layer 118.

In the present embodiment, although an example in which a transistor including an oxide semiconductor layer is applied to a pixel in the display region 103 was explained, the present invention is not limited to this example. The present invention may also be applied to transistors included in the scanning line drive circuit 104 and the data line drive circuit 105.

In the case where the display device 300 is a bendable display device, the substrate 101 is formed on a support substrate (not shown in the diagram) and as far as forming the second inorganic insulating layer 133 which functions as a sealing film. Next, after bonding the protective film 102 via the adhesive material 135, the support substrate is peeled off by irradiating laser light from the back side of the support substrate. Following this, the polarization plate 138 is bonded to the protective film 102, and the protective film 112 is bonded to the substrate 101, thereby it is possible to manufacture a bendable display device.

In the present embodiment, although a case where the present invention is applied to an organic EL display device using a light emitting element was explained as a display device, the present invention is not limited to this example. The present invention may be applied to a liquid crystal display device as a display device.

Fourth Embodiment

Figure 12:
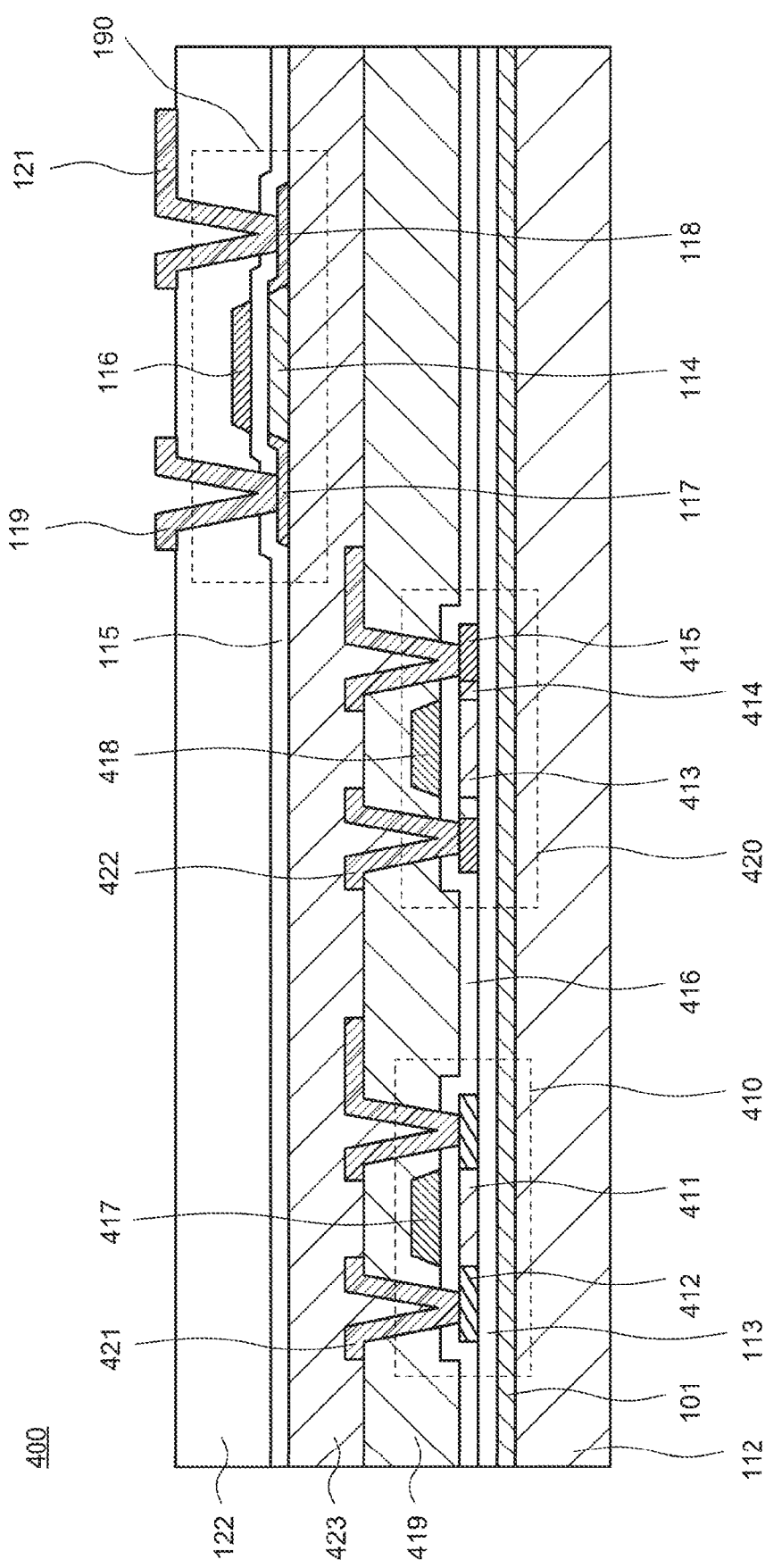
FIG. 12 is a cross-sectional view of a semiconductor device related to one embodiment of the present invention.

In the present embodiment, a structure of a semiconductor device according to another embodiment of the present invention is explained while referring to FIG. 12. In the present embodiment, a semiconductor device in which a transistor formed from an oxide semiconductor is arranged above a transistor formed from polysilicon is explained. Furthermore, an explanation of the same structure as in the other embodiments is omitted as appropriate.

The semiconductor device 400 shown in FIG. 12 includes a transistor 410, a transistor 420 and a transistor 190. The transistor 410 and the transistor 420 are arranged above the protective film 112 interposed by the substrate 101. In the transistor 410 and the transistor 420, polysilicon is used as a semiconductor layer and an oxide semiconductor is used as a semiconductor layer of the transistor 190.

Since the process temperature is as low as about 450° C., a transistor which uses an oxide semiconductor can be manufactured without affecting the characteristics of the transistor 410 and the transistor 420 formed from polysilicon. In this way, it is possible to form the transistor 190 formed from an oxide semiconductor above the transistor 410 and the transistor 420 formed from polysilicon.

The transistor 410 is a p-type transistor. The transistor 410 includes a polysilicon semiconductor layer, a gate insulating film 416 and a gate electrode 417. A channel 411 and an impurity region 412 including p-type impurities are included in the semiconductor layer of the transistor 410. In addition, the transistor 420 is an n-type transistor. The transistor 420 includes a polysilicon semiconductor layer, a gate insulating film 416 and a gate electrode 418. The semiconductor layer of the transistor 420 includes a channel 413, an impurity region 415 including an n-type impurity, and an impurity region 414 including an n-type impurity at a lower concentration than the impurity region 415.

An insulating layer 419 is arranged above the transistor 410 and the transistor 420. In addition, the insulating layer 419 is arranged with a plurality of opening parts. A source or drain electrode 421 and impurity region 412 are connected in one opening part, and a source or drain electrode 422 and impurity region 415 are connected in the other opening part.

An insulating layer 423 is arranged above the insulating layer 419, the source or drain electrode 421, and the source or drain electrode 422.

A transistor 190 which uses the oxide semiconductor layer 114 is arranged above the insulating layer 423.

In the semiconductor device 400 shown in FIG. 12, the conducting layer 117 and the conducting layer 118 which are in contact with a side surface of the oxide semiconductor layer 114 and which function as a source electrode or a drain electrode are arranged. Specifically, the end part of the lower surface of the conducting layer 116 matches the end part of the upper surface of the oxide semiconductor layer 114 or is located further inside than the end part of the upper surface of the oxide semiconductor layer 114. In addition, in the conducting layer 117 and the conducting layer 118, the end part of the surface in contact with the oxide semiconductor layer 114 substantially matches the end part of the upper surface of the oxide semiconductor layer 114 or is in a lower position than the end part of the upper surface of the oxide semiconductor layer 114. In this way, by arranging the conducting layer 116 to not overlap with the conducting layer 117 and the conducting layer 118, it is possible to reduce parasitic capacitance in the semiconductor device 400. In this way, it is possible to suppress RC delay caused by parasitic capacitance.

In addition, an insulating layer 122 is arranged above the transistor 190 and the insulating layer 122 includes a plurality of opening parts. The conducting layer 117 and the conducting layer 118 are connected with the oxide semiconductor layer 114 in openings.

As described above, in the semiconductor device 400 according to the present embodiment, RC delay caused by parasitic capacitance can be suppressed and thereby it is possible to accelerate circuit operations.

The semiconductor device 400 shown in the present embodiment, for example, can be applied to a display region of a display device or a drive circuit and the like.

Based on the semiconductor device of each embodiment, the appropriate addition, deletion, or design change of elements or the addition, deletion, or condition change of a process by a person ordinarily skilled in the art is included in the scope of the present invention as long as they possess the concept of the present invention. In addition, each embodiment described above can be mutually combined within a scope that does not produce a technical contradiction.

In addition, even if other actions and effects different from the actions and effects brought about by each embodiment described above are obvious from the description of this specification, or those which can be easily predicted by a person skilled in the art, it is to be understood that such actions and effects are obviously provided by the present invention.

What is claimed is:

1. A semiconductor device comprising:
    an oxide semiconductor layer above an insulating surface;
    a source electrode in contact with a first side surface of the oxide semiconductor layer;
    a drain electrode in contact with a second side surface of the oxide semiconductor layer;
    a gate insulating film above the oxide semiconductor layer, the source electrode, and the drain electrode; and
    a gate electrode overlapping with the oxide semiconductor layer interposed by the gate insulating film,
    wherein
    the gate electrode is arranged above and outside of the source electrode and the drain electrode,
    the gate insulating film includes a first region in contact with an upper surface of the oxide semiconductor layer, a second region in contact with an upper surface of the source electrode, and a third region in contact with an upper surface of the drain electrode,
    the first region, the second region, and the third region each have a flat surface,
    a film thickness of the oxide semiconductor layer is thicker than a film thickness of the source electrode and a film thickness of the drain electrode so that a first distance between the upper surface of the oxide semiconductor layer and the insulating surface is larger than each of a second distance between the upper surface of the source electrode and the insulating surface and a third distance between the upper surface of the drain electrode and the insulating surface, and
    the source electrode and the drain electrode do not overlap with the gate electrode in a planar view.

2. The semiconductor device according to claim 1, wherein a first angle formed by an upper surface of the drain electrode and the second side surface of the oxide semiconductor is an acute angle, and a second angle formed by an upper surface of the source electrode and the first side surface of the oxide semiconductor is an acute angle.

3. The semiconductor device according to claim 1, wherein the source electrode and the drain electrode include a metal having at least one element of Al, Ti, Cr, Co, Ni, Zn, Mo, Cu, In, Sn, Hf, Ta, W, Pt, Bi, or an alloy of these metals.

* * * * *